United States Patent
Mohammadnezhad et al.

(10) Patent No.: US 11,095,334 B1
(45) Date of Patent: Aug. 17, 2021

(54) AMPLIFIER CIRCUITRY FOR CARRIER AGGREGATION

(71) Applicant: Apple Inc., Cupertino, CA (US)

(72) Inventors: Seyed Mohammad Hossein Mohammadnezhad, San Diego, CA (US); Xi Yao, San Diego, CA (US); Aly Ismail, San Diego, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/028,598

(22) Filed: Sep. 22, 2020

(51) Int. Cl.
| | |
|---|---|
| *H03F 3/19* | (2006.01) |
| *H03F 1/26* | (2006.01) |
| *H04B 1/40* | (2015.01) |
| *H03F 1/22* | (2006.01) |
| *H03F 3/24* | (2006.01) |

(52) U.S. Cl.
CPC ............. *H04B 1/40* (2013.01); *H03F 3/245* (2013.01); *H03F 2200/294* (2013.01); *H03F 2200/451* (2013.01); *H03F 2200/541* (2013.01)

(58) Field of Classification Search
None
See application file for complete search history.

(56) References Cited

U.S. PATENT DOCUMENTS

| | | | |
|---|---|---|---|
| 8,310,309 B2 | 11/2012 | Behera et al. | |
| 9,374,043 B2 * | 6/2016 | Wang | H04B 1/40 |
| 9,379,673 B2 * | 6/2016 | Wang | H03F 3/193 |
| 9,407,226 B2 | 8/2016 | Liao | |
| 9,425,746 B2 * | 8/2016 | Uzunkol | H03F 1/30 |
| 9,479,131 B2 * | 10/2016 | Youssef | H03G 3/3036 |
| 9,819,310 B2 | 11/2017 | Wu et al. | |
| 10,033,340 B1 * | 7/2018 | Hanafi | H03F 1/0205 |
| 2017/0093339 A1 * | 3/2017 | Wu | H03F 3/72 |
| 2020/0091876 A1 | 3/2020 | Klaren | |
| 2020/0106394 A1 * | 4/2020 | Thoppay Egambaram | H03F 1/56 |
| 2021/0067115 A1 * | 3/2021 | Karmaker | H03F 3/45264 |

* cited by examiner

*Primary Examiner* — Pablo N Tran
(74) *Attorney, Agent, or Firm* — Treyz Law Group, P.C.; Jason Tsai

(57) ABSTRACT

An electronic device may include wireless circuitry with a baseband processor, a transceiver circuit, a front-end module, and an antenna. The front-end module may include amplifier circuitry such as a low noise amplifier for amplifying received radio-frequency signals. The amplifier circuitry is operable in a non-carrier-aggregation mode and a carrier aggregation mode. The amplifier circuitry may include an input transformer that is coupled to multiple amplifier stages such as a common gate amplifier stage, a cascode amplifier stage, and a common source amplifier stage. The common gate amplifier stage may include switches for selectively activating a set of cross-coupled capacitors to help maintain input impedance matching in the non-carrier-aggregation mode and the carrier-aggregation mode. The common source amplifier stage may include additional switches for activating and deactivating the common source amplifier stage to help maintain the gain in the non-carrier-aggregation mode and the carrier-aggregation mode.

20 Claims, 14 Drawing Sheets

AMPLIFIER CIRCUITRY FOR CARRIER AGGREGATION

FIELD

This disclosure relates generally to electronic devices and, more particularly, to electronic devices with wireless communications circuitry.

BACKGROUND

Electronic devices are often provided with wireless communications capabilities. An electronic device with wireless communications capabilities has wireless communications circuitry with one or more antennas. Wireless receiver circuitry in the wireless communications circuitry uses the antennas to receive radio-frequency signals.

Signals received by the antennas are fed through a radio-frequency front-end module, which often includes a low noise amplifier for amplifying the received radio-frequency signals. It can be challenging to design satisfactory low noise amplifier circuitry for an electronic device.

SUMMARY

An electronic device may include wireless communications circuitry configured to receive radio-frequency signals from one or more base stations. The wireless communications circuitry may include an antenna, transceiver circuitry configured to receive radio-frequency signals from the antenna and to generate corresponding baseband signals, and a baseband processor configured to receive the baseband signals from the transceiver circuitry. The wireless communications circuitry may further include amplifier circuitry interposed on a radio-frequency transmission line path between the antenna and the transceiver circuitry. The amplifier circuitry may include low noise amplifier circuitry configured to amplify radio-frequency signals received from the antenna.

The electronic device can optionally support carrier aggregation to combine component carriers from multiple base stations. The amplifier circuitry can be operable in a non-carrier-aggregation mode during which the amplifier circuitry receives signals from one carrier (from one base station) and can also be operable in a carrier-aggregation mode during which the amplifier circuitry receives signals from multiple component carriers (from at least two different base stations).

An aspect of this disclosure provides amplifier circuitry operable in a carrier-aggregation mode and a non-carrier-aggregation mode. The amplifier circuitry can include an input port configured to receive radio-frequency signals from an antenna, transformer circuitry coupled to the input port, a first amplifier coupled to the transformer circuitry, and a second amplifier coupled to the transformer circuitry. The first amplifier and the second amplifier can each include a common gate amplifier stage having an input coupled to the transformer circuitry and an output, a cascode amplifier stage having an input coupled to the output of the common gate amplifier stage and an output, a common source amplifier stage coupled to the cascode amplifier stage, the common source amplifier stage coupled to a common source bias voltage that is configured to activate and deactivate the common source amplifier stage in the non-carrier-aggregation mode and the carrier-aggregation mode, and an output port coupled to the output of the cascode amplifier stage.

The transformer circuitry can include a primary coil having a first terminal coupled to the input port and a second terminal coupled to a ground line, a first adjustable capacitor coupled in series between the input port and the first terminal, and a second adjustable capacitor having a first terminal coupled to the input port and a second terminal coupled to the ground line. The transformer circuitry can further include a first secondary coil coupled to the input of the common gate amplifier stage in the first amplifier, a third adjustable capacitor coupled in parallel with the first secondary coil, the third adjustable capacitor being configured to control an input impedance of the first amplifier in the non-carrier-aggregation mode and the carrier-aggregation mode, a second secondary coil coupled to the input of the common gate amplifier stage in the second amplifier, and a fourth adjustable capacitor coupled in parallel with the second secondary coil, the fourth adjustable capacitor being configured to control an input impedance of the second amplifier in the non-carrier-aggregation mode and the carrier-aggregation mode.

An aspect of this disclosure provides a method of operating amplifier circuitry. The method can include using an input port to receive radio-frequency signals from an antenna, using transformer circuitry to couple the radio-frequency signals from the input port to a first amplifier and to a second amplifier, using a common gate amplifier stage in each of the first and second amplifiers to receive the radio-frequency signals from the transformer circuitry and to output corresponding first amplified signals, using a cascode amplifier stage in each of the first and second amplifiers to receive the first amplified signals and to output corresponding second amplified signals, and using a common source amplifier stage in each of the first and second amplifiers to further amplify the second amplified signals to output corresponding carrier aggregation output signals, adjusting a common source bias voltage in the common source amplifier stage in each of the first and second amplifiers in a carrier-aggregation mode and a non-carrier-aggregation mode. The method can further include using a first input capacitor coupled to the first amplifier to tune an input impedance of the first amplifier in the carrier-aggregation mode and the non-carrier-aggregation mode, and using a second input capacitor coupled to the second amplifier to tune an input impedance of the second amplifier in the carrier-aggregation mode and the non-carrier-aggregation mode.

An aspect of this disclosure provides an electronic device operable in a carrier-aggregation mode and a non-carrier-aggregation mode. The electronic device can include an antenna configured to receive radio-frequency signals, a transceiver configured to generate baseband signals based on the radio-frequency signals, a baseband processor configured to receive the baseband signals, and amplifier circuitry configured to receive the radio-frequency signals from the antenna and to output corresponding amplified signals to the transceiver. The amplifier circuitry can include an input port, transformer circuitry coupled to the input port, a common gate amplifier stage having an input coupled to the transformer circuitry and an output, a cascode amplifier stage having an input coupled to the output of the common gate amplifier stage and an output, a common source amplifier stage coupled to the cascode amplifier stage, the common source amplifier coupled to a common source bias voltage configured to control the common source stage in the non-carrier-aggregation mode and the carrier-aggregation mode, and an output port coupled to the output of the cascode amplifier stage. The transformer circuitry can include a primary coil having a first terminal coupled to the input port and a second terminal coupled to ground. The transformer circuitry can include a secondary coil coupled to the input of the common gate amplifier stage. The amplifier circuitry can include an adjustable capacitor coupled in parallel with the secondary coil. The adjustable capacitor can be configured to tune an input impedance of the common gate amplifier stage in the non-carrier-aggregation mode and the carrier-aggregation mode.

DETAILED DESCRIPTION

Figure 1:
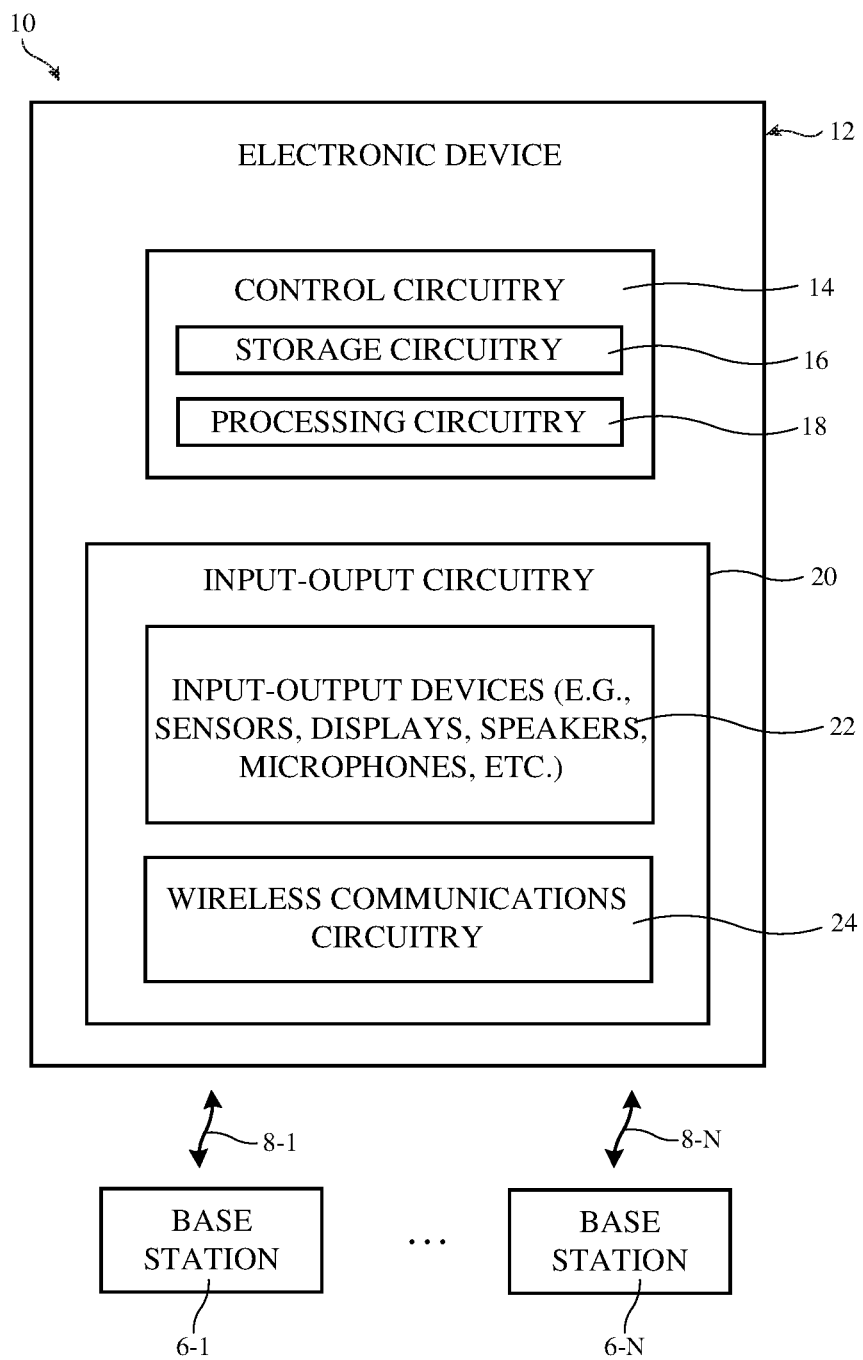
FIG. 1 is a diagram of an illustrative electronic device with wireless communications circuitry configured to wirelessly communicate with multiple external devices in accordance with some embodiments.

An electronic device such as electronic device 10 of FIG. 1 may be provided with wireless circuitry. The wireless circuitry may include an amplifier such as a low noise amplifier operable in a non-carrier-aggregation mode to support communications at one frequency with a single base station or in a carrier-aggregation mode to support communications at multiple frequencies with at least two different base stations. The low noise amplifier (sometimes referred to as amplifier circuitry) may include an input port configured to receive radio-frequency signals from an antenna, an input transformer, a first amplifier, and a second amplifier. The first and second amplifiers may have a common gate amplifier stage and a cascode stage. The common gate amplifier stage can have cross-coupled capacitors that are activated and deactivated to tune the input impedance of the first and second amplifiers. The cascode stage may be further coupled to a common source stage that is activated in the carrier-aggregation mode to help cancel noise and other undesired non-linearity arising from the cascode stage. The input transformer can optionally be tuned using adjustable input capacitors. Configured and operated as such, the input impedance and the gain of the low noise amplifier can be maintained when switching between the non-carrier-aggregation mode and the carrier-aggregation mode.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the schematic diagram FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G New Radio (NR) protocols, etc.), MIMO protocols, antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays, light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, electronic pencil (e.g., a stylus), and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 24 may include wireless communications circuitry such as wireless communications circuitry 34 (sometimes referred to herein as wireless circuitry 24) for wirelessly conveying radio-frequency signals. While control circuitry 14 is shown separately from wireless communications circuitry 24 for the sake of clarity, wireless communications circuitry 24 may include processing circuitry that forms a part of processing circuitry 18 and/or storage circuitry that forms a part of storage circuitry 16 of control circuitry 14 (e.g., portions of control circuitry 14 may be implemented on wireless communications circuitry 24). As an example, control circuitry 14 (e.g., processing circuitry 18) may include baseband processor circuitry or other control components that form a part of wireless communications circuitry 24.

Wireless communications circuitry 24 may include radio-frequency (RF) transceiver circuitry formed from one or more integrated circuits, power amplifier circuitry configured to amplify uplink radio-frequency signals (e.g., radio-frequency signals transmitted by device 10 to an external device), low-noise amplifiers configured to amplify downlink radio-frequency signals (e.g., radio-frequency signals received by device 10 from an external device), passive radio-frequency components, one or more antennas, transmission lines, and other circuitry for handling radio-frequency wireless signals. Wireless signals can also be sent using light (e.g., using infrared communications).

Wireless circuitry 24 may include radio-frequency transceiver circuitry for handling transmission and/or reception of radio-frequency signals in various radio-frequency communications bands. For example, the radio-frequency transceiver circuitry may handle wireless local area network (WLAN) communications bands such as the 2.4 GHz and 5 GHz Wi-Fi® (IEEE 802.11) bands, wireless personal area network (WPAN) communications bands such as the 2.4 GHz Bluetooth® communications band, cellular telephone communications bands such as a cellular low band (LB) (e.g., 600 to 960 MHz), a cellular low-midband (LMB) (e.g., 1400 to 1550 MHz), a cellular midband (MB) (e.g., from 1700 to 2200 MHz), a cellular high band (HB) (e.g., from 2300 to 2700 MHz), a cellular ultra-high band (UHB) (e.g., from 3300 to 5000 MHz), or other cellular communications bands between about 600 MHz and about 5000 MHz (e.g., 3G bands, 4G LTE bands, 5G New Radio Frequency Range 1 (FR1) bands below 10 GHz, 5G New Radio Frequency Range 2 (FR2) bands at millimeter and centimeter wavelengths between 20 and 60 GHz, etc.), a near-field communications (NFC) band (e.g., at 13.56 MHz), satellite navigations bands (e.g., an L1 global positioning system (GPS) band at 1575 MHz, an L5 GPS band at 1176 MHz, a Global Navigation Satellite System (GLONASS) band, a BeiDou Navigation Satellite System (BDS) band, etc.), an ultra-wideband (UWB) communications band supported by the IEEE 802.15.4 protocol and/or other UWB communications protocols (e.g., a first UWB communications band at 6.5 GHz and/or a second UWB communications band at 8.0 GHz), and/or any other desired communications bands. The communications bands handled by such radio-frequency transceiver circuitry may sometimes be referred to herein as frequency bands or simply as "bands," and may span corresponding ranges of frequencies. In general, the radio-frequency transceiver circuitry within wireless circuitry 24 may cover (handle) any desired frequency bands of interest.

Device 10 can communicate with external devices such as accessories, computing equipment, and wireless networks over wired and wireless communications paths. For example, device 10 may communicate with wireless network equipment such as one or more cellular telephone base stations 6 over corresponding wireless links 8. In the example of FIG. 1, one or more of antennas in wireless communications circuitry 24 may communicate with a first base station 6-1 over a first communications link 8-1, may communicate with a second base station 6-N over a second communications link 8-N, or may simultaneously communicate with base stations 6-1 and 6-N over both communications links 8-1 and 8-N, respectively. In one embodiment, wireless communications circuitry 24 may simultaneously convey information with first base station 6-1 in a first communications band associated with link 8-1 and second base station 6-N in a second communications band associated with link 8-N in a scheme sometimes referred to as carrier aggregation.

When operating using a carrier aggregation scheme, the first base station 6 with which device 10 establishes a corresponding wireless link 8 may sometimes be referred to herein as a Primary Component Carrier (PCC) or primary base station. Radio-frequency signals conveyed between the primary base station and device 10 may sometimes be referred to herein as primary component carrier signals, primary signals, primary component signals, primary carrier signals, or PCC signals, and the wireless link 8 between the primary base station and device 10 may sometimes be referred to herein as a primary connection or primary wireless link. Once a connection is established between device 10 and the primary base station, device 10 may establish an additional wireless connection with another base station 6 without dropping the connection with the primary base station, and may simultaneously communicate with both base stations (e.g., using different frequency bands in a carrier aggregation scheme). Additional base stations that establish a connection with device 10 after device 10 has established a wireless connection with a primary base station may sometimes be referred to herein as Secondary Component Carriers (SCCs) or secondary base stations. Radio-frequency signals conveyed between the secondary base station and device 10 may sometimes be referred to herein as secondary component carrier signals, secondary signals, secondary component signals, secondary carrier signals, or SCC signals, and the wireless link 8 between the secondary base station and device 10 may sometimes be referred to herein as secondary connections or secondary wireless links. Device 10 may establish a connection with a primary base station and one or more secondary base stations in downlink and uplink communications bands if desired.

Combining data from multiple component carriers using carrier aggregation can dramatically increase data throughput. As examples, wireless communications circuitry 24 may be configured to aggregate data streams from at least two component carriers, up to five component carriers, two to five component carriers, more than five component carriers, up to 16 component carriers, 5-16 component carriers, more than 16 component carriers, up to 32 component carriers, 16-32 component carriers, more than 32 component carriers, up to 64 component carriers, 32-64 component carriers, more than 64 component carriers, 64-100 component carriers, more than 100 component carriers, hundreds of component carriers, less than 100 component carriers, less than 64 component carriers, less than 32 component carriers, or other suitable number of component carriers. The combined bandwidth from aggregating multiple component carriers in this way can be as high as 100 MHz or more, 200 MHz or more, 300 MHz or more, 400 MHz or more, 500 MHz or more, 500 MHz to 1 GHz, or even greater than 1 GHz.

The various component carriers being aggregated may or may not belong to the same frequency band. Scenarios in which multiple component carriers within the same frequency band are being aggregated are sometimes referred to as intra-band carrier aggregation. In particular, if the multiple component carriers within the same frequency band are in contiguous frequency blocks without any frequency gaps separating them, such type of intra-band aggregation may further be referred to as intra-band contiguous carrier aggregation. If the multiple component carriers within the same frequency band are in noncontiguous frequency blocks that are separated by one or more frequency gaps, such type of intra-band aggregation may further be referred to as intra-band noncontiguous carrier aggregation. In yet other scenarios, multiple component carriers from different frequency bands may be aggregated together. Such type of carrier aggregation may be referred to as inter-band carrier aggregation.

In general, carrier aggregation may combine component carriers from 3G bands, 4G LTE bands, 5G NR bands, or other cellular telephone communications bands, WLAN communications bands, WPAN communications bands, the NFC band, the GPS bands, the GLONASS band, the UWB communications band, a combination of these bands, or other desired communications bands. As an example, multiple contiguous or noncontiguous component carriers in one or more 4G LTE bands may be aggregated together to perform 4G LTE carrier aggregation. As another example, multiple contiguous or noncontiguous component carriers in one or more 5G NR bands may be aggregated together to perform 5G NR carrier aggregation. As another example, one or more component carriers from a 4G LTE band may be aggregated with one or more component carriers from a 5G NR band to perform dual connectivity carrier aggregation. As another example, multiple component carriers from two or more 4G LTE frequency bands may be aggregated with multiple component carriers from two or more 5G NR frequency bands. As another example, component carriers from one or more 4G LTE frequency bands may be aggregated with another type of cellular technology band (e.g., one or more GSM frequency bands, one or more EDGE frequency bands, one or more 3G frequency bands, one or more 5G NR frequency bands, etc.). As another example, component carriers from one or more 5G NR frequency bands may be aggregated with another type of cellular technology band (e.g., one or more GSM frequency bands, one or more EDGE frequency bands, one or more 3G frequency bands, one or more LTE frequency bands, etc.). These examples are merely illustrative. In general, any number of contiguous or noncontiguous component carriers from one or more frequency bands associated with any suitable wireless communications protocol may be aggregated together to help boost data throughput for wireless communications circuitry 24.

Figure 2:
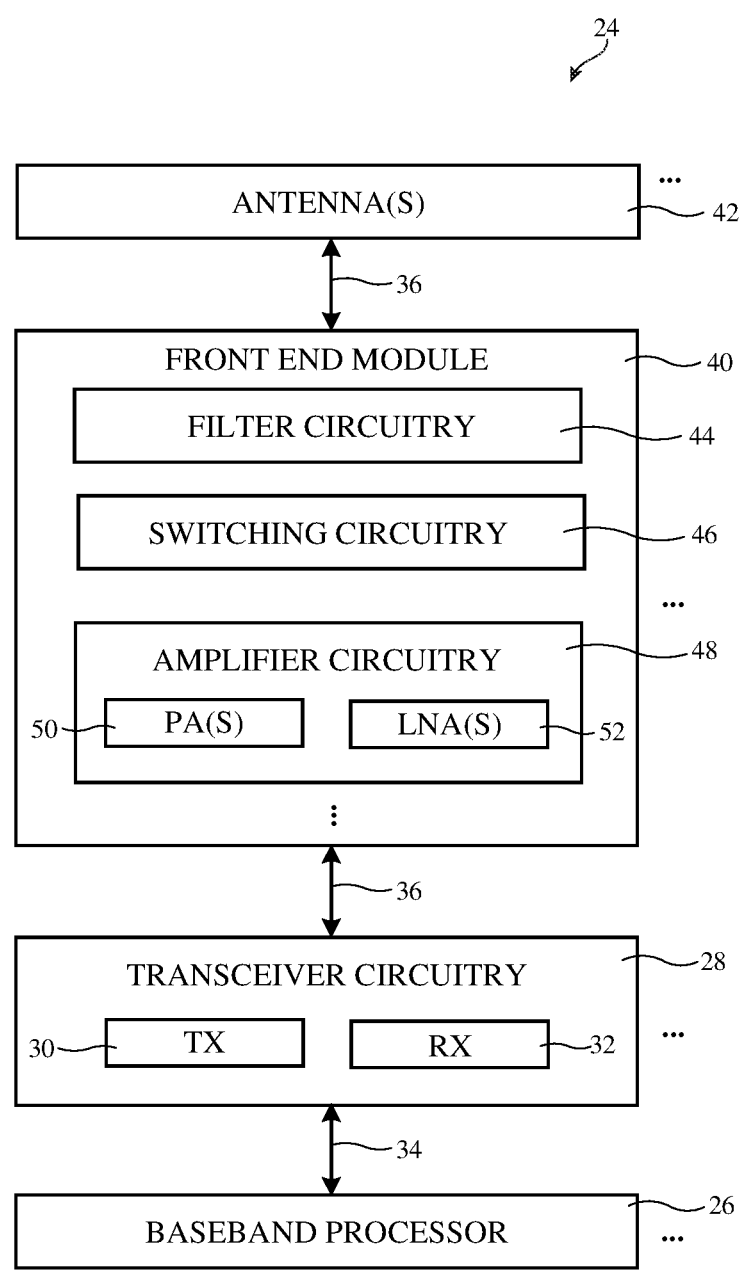
FIG. 2 is a diagram of illustrative wireless communications circuitry having a front-end module coupled between antennas and transceiver circuitry in accordance with some embodiments.

FIG. 2 is a diagram showing illustrative components within wireless circuitry 24. As shown in FIG. 2, wireless circuitry 24 may include a baseband processor such as baseband processor 26, radio-frequency (RF) transceiver circuitry such as radio-frequency transceiver 28, radio-frequency front end circuitry such as radio-frequency front end module (FEM) 40, and antenna(s) 42. Baseband processor 26 may be coupled to transceiver 28 over baseband path 34. Transceiver 28 may be coupled to antenna 42 via radio-frequency transmission line path 36. Radio-frequency front end module 40 may be interposed on radio-frequency transmission line path 36 between transceiver 28 and antenna 42.

In the example of FIG. 2, wireless circuitry 24 is illustrated as including only a single baseband processor 26, a single transceiver 28, a single front end module 40, and a single antenna 42 for the sake of clarity. In general, wireless circuitry 24 may include any desired number of baseband processors 26, any desired number of transceivers 36, any desired number of front end modules 40, and any desired number of antennas 42. Each baseband processor 26 may be coupled to one or more transceiver 28 over respective baseband paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 interposed thereon. If desired, two or more front end modules 40 may be interposed on the same radio-frequency transmission line path 36. If desired, one or more of the radio-frequency transmission line paths 36 in wireless circuitry 24 may be implemented without any front end module interposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards. In one embodiment, radio-frequency transmission line paths such as radio-frequency transmission line path 36 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

In performing wireless transmission, baseband processor 26 may provide baseband signals to transceiver 28 over baseband path 34. Transceiver 28 may further include circuitry for converting the baseband signals received from baseband processor 26 into corresponding radio-frequency signals. For example, transceiver circuitry 28 may include mixer circuitry for up-converting (or modulating) the baseband signals to radio-frequencies prior to transmission over antenna 42. Transceiver circuitry 28 may also include digital-to-analog converter (DAC) and/or analog-to-digital converter (ADC) circuitry for converting signals between digital and analog domains. Transceiver 28 may use transmitter 30 to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry for converting the received radio-frequency signals into corresponding baseband signals. For example, transceiver 28 may include mixer circuitry for down-converting (or demodulating) the received radio-frequency signals to baseband frequencies prior to conveying the received signals to baseband processor 26 over baseband path 34.

Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be interposed within radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, baseband processor 26 and/or portions of transceiver 28 (e.g., a host processor on transceiver 28) may form a part of control circuitry 14. Control circuitry 14 (e.g., portions of control circuitry 14 formed on baseband processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

As described above, front end module 40 may include one or more low noise amplifier (LNA) circuits 52 in the receive (downlink) path. A low noise amplifier 52 (sometimes referred to as low noise amplifier circuitry or amplifier circuitry) may be configured to amplify a received radio-frequency signal without significantly degrading the signal-to-noise (SNR) ratio of the amplified signal. Low noise amplifier 52 may, for example, be used to provide 2 dB of voltage gain, 3 dB of voltage gain, 4 dB of voltage gain, 5 dB of voltage gain, 6 dB of voltage gain, 3-4 dB of voltage gain, 2-5 dB of voltage gain, 5-10 dB of voltage gain, or other suitable amounts of voltage gain.

Figure 3:
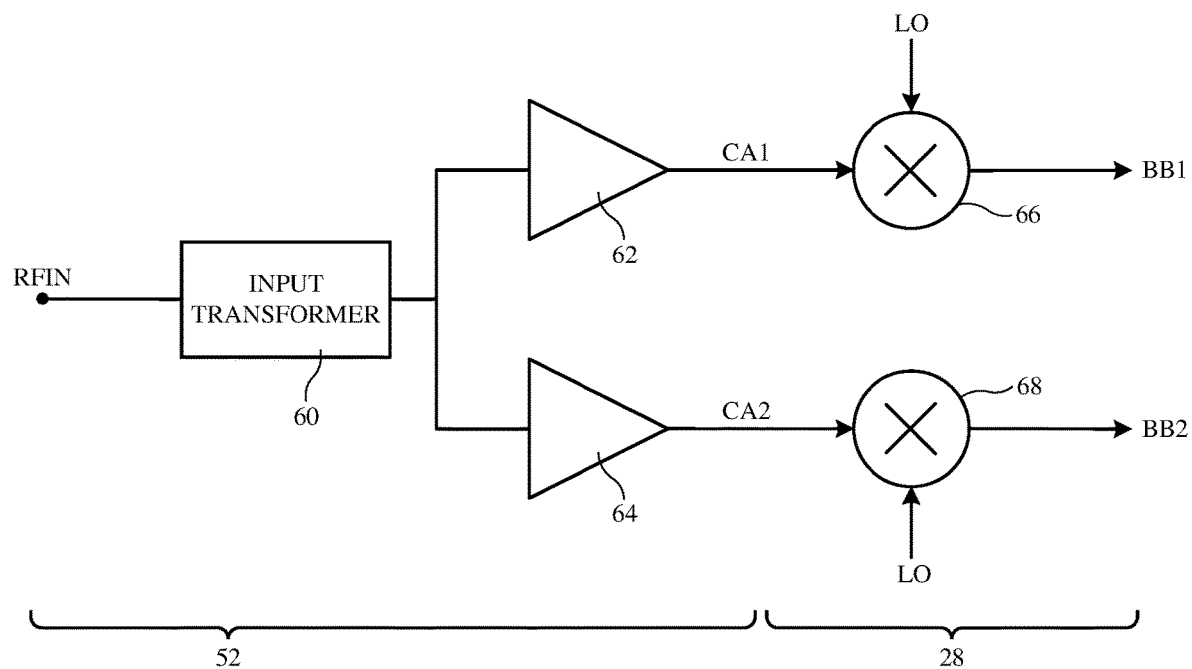
FIG. 3 is a diagram of illustrative amplifier circuitry coupled to mixer circuitry in accordance with some embodiments.

FIG. 3 is a diagram of illustrative low noise amplifier circuitry 52 coupled to transceiver 28. As shown in FIG. 3, amplifier circuitry 52 has an input port RFIN configured to receive radio-frequency signals from the antenna, an input transformer such as input transformer circuitry 60, a first amplifier 62, and a second amplifier 64. Transformer circuitry 60 may feed signals to both first amplifier 62 and second amplifier 64 in parallel. First amplifier 62 has a first carrier aggregation output port CA1, whereas second amplifier 64 has a second carrier aggregation output port CA2. Transceiver 28 may include, among other wireless transceiver components, mixer circuitry such as a first mixer 66 and a second mixer 68. First mixer 66 may receive signals from the first carrier aggregation output port CA1 of first amplifier 62 and a local oscillator signal LO. Second mixer 68 may receive signals from the second carrier aggregation output port CA2 of second amplifier 64 and another local oscillator signal. The local oscillator signals received by mixers 66 and 68 may be the same or may be different (e.g., the local oscillator signals may have the same frequency but a phase offset). Mixer 66 may then output a corresponding first baseband output signal BB1 associated with one component carrier. Similarly, mixer 68 may output a corresponding second baseband output signal BB2 associated with another component carrier. Baseband signals BB1 and BB2 can then be provided to baseband processor 26 (see FIG. 2).

In device 10 that supports carrier aggregation of multiple component carriers, device 10 may include one or more low noise amplifiers 52 operable in a non-carrier-aggregation (NCA) mode and a carrier-aggregation (CA) mode. Ideally, the gain and the input matching characteristics associated with the low noise amplifier should be identical in both the NCA and CA modes of operation. If care is not taken in the low noise amplifier design, however, the gain and input impedance of the low noise amplifier circuitry may be mismatched when switching from the NCA mode to the CA mode and vice versa.

Figure 4:
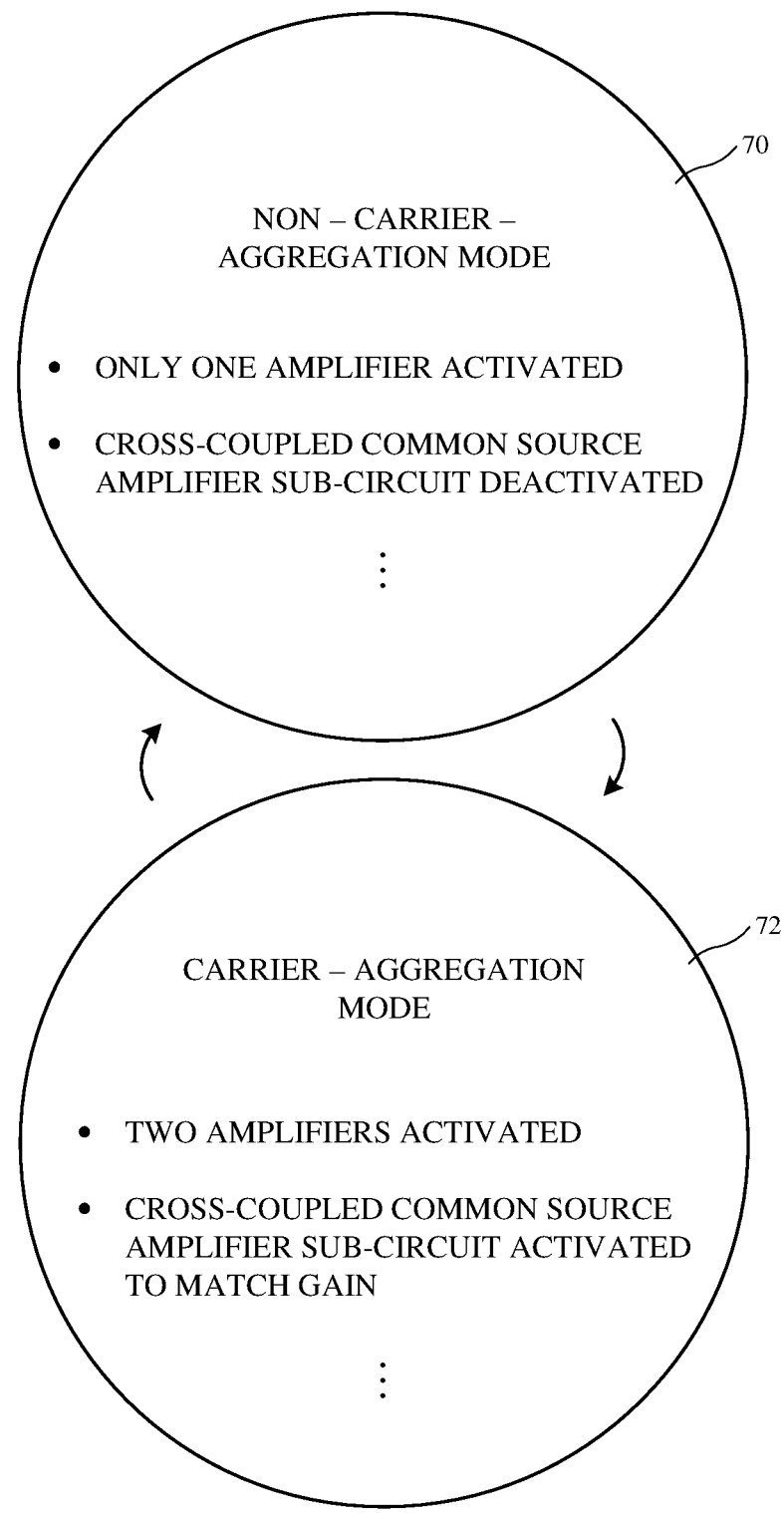
FIG. 4 is a state diagram showing how an illustrative low noise amplifier is operable in a non-carrier-aggregation mode and a carrier-aggregation mode in accordance with some embodiments.

FIG. 4 is a state diagram illustrating how low noise amplifier circuitry 52 may toggle between a non-carrier-aggregation mode 70 and a carrier-aggregation mode 72. When amplifier circuitry 52 is operated in non-carrier-aggregation mode 70, only one of the two amplifiers 62 and 64 is activated. As an example, only first amplifier 62 is activated while second amplifier 64 is deactivated or idled. As another example, only second amplifier 64 is turned on (in use) while first amplifier 62 is turned off (not in use). In either scenario, the amplifier that is activated may include a cross-coupled common source amplifier stage that is deactivated during non-carrier-aggregation mode 70.

When amplifier circuitry 52 is operated in carrier-aggregation mode 72, both amplifiers 62 and 64 are activated. In mode 72, first amplifier 62 will output signals at the first carrier aggregation output port CA1 while second amplifier 64 simultaneously outputs signals at the second carrier aggregation output port CA2. Unlike mode 70, amplifiers 62 and 64 may each include a cross-coupled common source amplifier stage that is activated (switched into use) during carrier-aggregation mode 72. Switching the cross-coupled common source amplifier stage into use can help recover any gain that might otherwise have been reduced when splitting current from the input transformer between two amplifiers while also providing the benefit of cancelling out noise and other higher order non-linearity terms associated with other stages in amplifier circuitry 52. The first and second amplifiers may including switching circuitry configured to control (i.e., to activate and deactivate) at least a portion of low noise amplifier circuitry 52 when switching between mode 70 and mode 72. Details of such switching circuitry may depend on the particular implementation of amplifier circuitry 52, which is described in more detail below in connection with FIGS. 5-7.

Figure 5A:
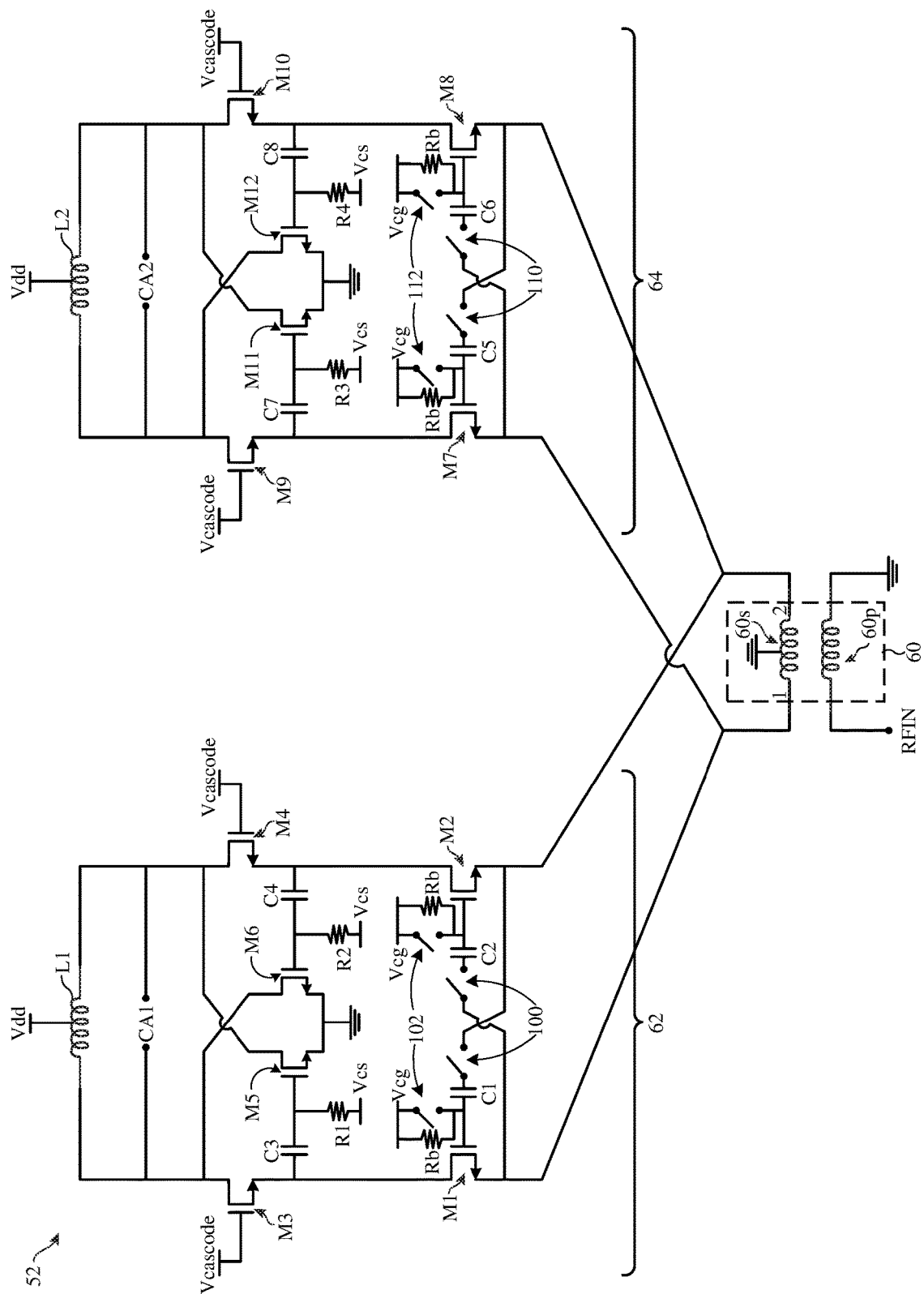
FIG. 5A is a circuit diagram of illustrative low noise amplifier circuitry having a signal split at a common gate amplifier input in accordance with some embodiments.

FIG. 5A is a circuit diagram showing one suitable embodiment of low noise amplifier circuitry 52 operable to provide input matching and equal gain in both the non-carrier-aggregation mode and the carrier-aggregation mode. As shown in FIG. 5A, amplifier circuitry 52 includes an input port RFIN, input transformer circuitry 60, first amplifier 62, and second amplifier 62. Input port RFIN may be configured to receive a radio-frequency signal from the antenna. As described in connection with FIG. 2, one or more circuits such as filter circuitry, switching circuitry, antenna tuning circuitry, and/or other control circuitry may optionally be coupled along the radio-frequency transmission line path 36 between the antenna and the amplifier input port RFIN.

Transformer circuitry 60 may include a primary winding such as primary winding 60p and a secondary winding such as secondary winding 60s. Primary winding 60p and secondary winding 60s may sometimes be referred to as a primary coil and a secondary coil, respectively. Primary winding 60p may be a single-ended coil having a first terminal coupled to input port RFIN and a second terminal coupled to a ground line (e.g., a ground power supply line on which a ground signal is provided). Secondary winding 60s may be configured to support differential signaling. In particular, secondary coil 60s has a first (1) terminal coupled to both amplifiers 62 and 64 and a second (2) terminal also coupled to both amplifiers 62 and 64. Secondary coil 60s may have a center tap coupled to the ground line.

First amplifier 62 may include transistors M1-M6 forming parts of different amplifier stages within the first amplifier. In the example of FIG. 5A, transistors M1-M6 are n-channel metal-oxide-semiconductor (NMOS) transistors. This is merely illustrative. If desired, at least some of transistors M1-M6 may be implemented as p-channel metal-oxide-semiconductor (PMOS) transistors. As another example, all of transistors M1-M6 may be PMOS transistors. In general, any suitable type of semiconductor switching component may be used. Configurations in which transistors M1-M6 are implemented as NMOS transistors may sometimes be described herein as an example.

Transistor M1 has a source (input) terminal coupled to the first terminal of secondary coil 60s, a gate (control) terminal, and a drain (output) terminal. The terms "source" and "drain" terminals used to refer to current-conveying terminals in a transistor may be used interchangeably and are sometimes referred to as "source-drain" terminals. Thus, the source terminal of transistor M1 can be referred to as a first source-drain terminal, and the drain terminal of transistor M1 can be referred to as a second source-drain terminal (or vice versa). Transistor M2 has a source (input) terminal coupled to the second terminal of secondary coil 60s, a gate terminal, and a drain (output) terminal.

The gate terminal of transistor M1 may be selectively coupled to the source terminal of transistor M2 via a capacitor C1 by turning on and off a first switch 100. Similarly, the gate terminal of transistor M2 may be selectively coupled to the source terminal of transistor M1 via a capacitor C2 by turning on and off a second switch 100. Thus, when switches 100 are activated, transistors M1 and M2 are said to be cross-coupled via capacitors C1 and C2 (e.g., the control terminal of M1 is cross-coupled to the input terminal of M2 via C1, whereas the control terminal of M2 is cross-coupled to the input terminal of M1 via C2).

The gate terminal of transistor M1 can also be coupled to a common gate voltage line on which common gate voltage Vcg is provided via a first biasing resistor Rb and a first switch 102. When transistor M1 is on and connected to the cross-coupled capacitors C1 and C2 (i.e., when switches 100 are turned on), first switch 102 is off and the gate of transistor M1 is biased through resistor Rb connected to voltage Vcg. When transistor M1 is on and disconnected from the cross-coupled capacitors C1 and C2 (i.e., when switches 100 are turned off), first switch 102 is on and the gate of transistor M1 is directly connected to DC voltage Vcg. When transistor M1 is off, voltage Vcg is set to 0 V. Voltage Vcg may have some intermediate voltage level between the ground voltage level and a positive power supply voltage level Vdd that powers amplifier circuitry 52. If desired, common gate voltage Vcg may also be equal to positive power supply voltage Vdd.

Similarly, the gate terminal of transistor M2 can also be coupled to the common gate voltage line via a second biasing resistor Rb and a second switch 102. When transistor M2 is on and connected to the cross-coupled capacitors C1 and C2 (i.e., when switches 100 are turned on), second switch 102 is off and the gate of transistor M2 is biased through second resistor Rb connected to voltage Vcg. When transistor M2 is on and disconnected from the cross-coupled capacitors C1 and C2 (i.e., when switches 100 are turned off), second switch 102 is on and the gate of transistor M2 is directly connected to DC voltage Vcg. When transistor M2 is off, voltage Vcg is set to 0 V. Transistors M1 and M2, along with cross-coupled capacitors C1 and C2 and the associated switches 100 and 102, operated in this way may therefore sometimes be referred to collectively as a common gate amplifier stage. A common gate amplifier stage can be defined as an amplifier stage with an amplifying transistor having its gate terminal coupled to a common (fixed) voltage source (e.g., Vcg). Switches 100 and 102 and the DC voltage level of Vcg may therefore be used to control the common gate amplifier stage in first amplifier 62.

Transistor M3 has a source (input) terminal coupled to the output terminal of transistor M1, a gate (control) terminal, and a drain (output) terminal. Similarly, transistor M4 has a source (input) terminal coupled to the output terminal of transistor M2, a gate (control) terminal, and a drain (output) terminal. The drain terminals of transistors M3 and M4 may serve as the first carrier aggregation output port CAL A first output coil L1 may be coupled across first carrier aggregation output port CAL Output coil L1 may have a center tap that is coupled to a positive power supply line on which positive power supply voltage Vdd is provided.

The gate terminals of transistors M3 and M4 may be coupled to a cascode bias voltage line on which cascode bias voltage Vcascode is provided. Voltage Vcascode may have some intermediate voltage level between the ground voltage level and positive power supply voltage level Vdd that powers amplifier circuitry 52. If desired, voltage Vcascode may also be equal to positive power supply voltage Vdd. Transistors M3 and M4 coupled in series to the output of the common gate amplifier stage in this way are sometimes referred to collectively as a cascode amplifier stage or a cascode common gate amplifier stage. A cascode amplifier stage can be defined as an amplifier stage with an amplifying transistor that is coupled to the output of a preceding amplifier stage such as the common gate amplifier stage and that has its gate terminal coupled to a common (fixed) voltage source (e.g., Vcascode). The cascode amplifier stage with M3 and M4 may be used to increase the output impedance of amplifier 62, improve isolation between amplifiers 62 and 64, and can optionally be used to provide different gain steps (e.g., by selectively adjusting the drive strength of transistors M3 and M4).

Transistors M5 and M6 may be selectively cross-coupled with the cascode transistors M3 and M4. Transistor M5 has a gate terminal that is coupled to the input terminal of transistor M3 via capacitor C3 and that is also coupled to, via resistor R1, a common source voltage line on which common source bias voltage Vcs is provided. Transistor M5 also has a source terminal coupled to ground and a drain terminal that is selectively coupled to the output terminal of transistor M4. Similarly, transistor M6 has a gate terminal that is coupled to the input terminal of transistor M4 via capacitor C4 and that is also coupled to, via resistor R2, the common source voltage line to receive common source voltage Vcs. Transistor M6 also has a source terminal coupled to ground and a drain terminal that is selectively coupled to the output terminal of transistor M3.

Transistors M5 and M6 are cross-coupled with the cascode amplifier stage. Transistors M5 and M6, along with capacitors C3 and C5 and resistors R1 and R2, operated in this way may therefore sometimes be referred to collectively as a common source amplifier stage. A common source amplifier stage can be defined as an amplifier stage with an amplifying transistor having its source terminal coupled to a common (fixed) voltage source (e.g., the ground voltage). Transistors M5 and M6 can be turned off by setting voltage Vcs to zero volts (to deactivate the common source stage) or can be turned on by setting voltage Vcs to a proper voltage level that is greater than 0 V (to activate the common source stage).

The structure of second amplifier 64 may be similar to the structure of first amplifier 62. Second amplifier 64 may include transistors M7-M12 forming parts of different amplifier stages within the second amplifier. In the example of FIG. 5A, transistors M7-M12 are n-channel transistors. This is merely illustrative. If desired, at least some of transistors M7-M12 may be implemented as p-channel transistors. As another example, all of transistors M7-M12 may be PMOS transistors. In general, any suitable type of semiconductor switching component may be used. Configurations in which transistors M7-M12 are implemented as NMOS transistors may sometimes be described herein as an example.

Transistor M7 has a source (input) terminal coupled to the first terminal of secondary coil 60s, a gate (control) terminal, and a drain (output) terminal. Transistor M8 has a source (input) terminal coupled to the second terminal of secondary coil 60s, a gate terminal, and a drain (output) terminal. The gate terminal of transistor M7 may be selectively coupled to the source terminal of transistor M8 via a capacitor C5 by turning on and off a first switch 110. Similarly, the gate terminal of transistor M8 may be selectively coupled to the source terminal of transistor M7 via a capacitor C6 by turning on and off a second switch 110. Thus, when switches 110 are activated, transistors M7 and M8 are said to be cross-coupled via capacitors C5 and C6 (e.g., the control terminal of M7 is cross-coupled to the input terminal of M8 via C5, whereas the control terminal of M8 is cross-coupled to the input terminal of M7 via C6).

The gate terminal of transistor M7 can also be coupled to the common gate voltage line via a third resistor Rb and a first switch 112. Similarly, the gate terminal of transistor M8 can also be coupled to the common gate voltage line via a fourth resistor Rb and a second switch 112. When transistors M7 and M8 are on and connected to the cross-coupled capacitors C5 and C6 (i.e., when switches 110 are turned on), switches 112 are off and the gates of transistors M7 and M8 are biased through resistors Rb connected to voltage Vcg. When transistors M7 and M8 are on and disconnected from the cross-coupled capacitors C5 and C6 (i.e., when switches 110 are turned off), switches 112 is on and the gates of transistors M7-M8 are directly connected to DC voltage Vcg. When transistors M7-M8 are off, voltage Vcg is set to 0 V. Transistors M7 and M8, along with cross-coupled capacitors C5 and C6 and the associated switches 110 and 112, operated in this way may therefore sometimes be referred to collectively as a common gate amplifier stage. Switches 110 and 112 and the DC voltage level of Vcg may therefore be used to control the common gate amplifier stage in second amplifier 64.

Transistor M9 has a source (input) terminal coupled to the output terminal of transistor M7, a gate (control) terminal, and a drain (output) terminal. Similarly, transistor M10 has a source (input) terminal coupled to the output terminal of transistor M8, a gate (control) terminal, and a drain (output) terminal. The drain terminals of transistors M9 and M10 may serve as the second carrier aggregation output port CA2. A second output coil L2 may be coupled across second carrier aggregation output port CA2. Output coil L2 may have a center tap that is coupled to the positive power supply line.

The gate terminals of transistors M9 and M10 may be coupled to the cascode bias voltage line. Transistors M9 and M10 coupled in series to the output of the common gate amplifier stage in this way are sometimes referred to collectively as a cascode amplifier stage. The cascode amplifier stage with M9 and M10 may be used to increase the output impedance of amplifier 64, improve isolation between amplifiers 64 and 62, and can optionally be used to provide different gain steps (e.g., by selectively adjusting the drive strength of transistors M9 and M10).

Transistors M11 and M12 may be selectively cross-coupled with the cascode transistors M9 and M10. Transistor M11 has a gate terminal that is coupled to the input terminal of transistor M9 via capacitor C7 and that is also coupled to, via resistor R3, the common source voltage line. Transistor M11 also has a source terminal coupled to the ground line and a drain terminal that is selectively coupled to the output terminal of transistor M10. Similarly, transistor M12 has a gate terminal that is coupled to the input terminal of transistor M10 via capacitor C8 and that is also coupled to, via resistor R4, the common source voltage line to receive common source voltage Vcs. Transistor M12 also has a source terminal coupled to ground and a drain terminal that is selectively coupled to the output terminal of transistor M9.

Transistors M11 and M12 are cross-coupled with the cascode amplifier stage. Transistors M11 and M12, along with capacitors C7 and C8, and resistors R3 and R4 operated in this way may therefore sometimes be referred to collectively as a common source amplifier stage. Transistors M11 and M12 can be turned off by setting voltage Vcs to zero volts (to deactivate the common source amplifier stage) or can be turned on by setting voltage Vcs to a proper voltage level greater than 0 V (to activate the common source amplifier stage).

Switches 100, 102, 110, and 112 shown in FIG. 5A can be any type of semiconductor switches. As an example, at least some of these switches can be implemented as metal-oxide-semiconductor field effect transistors (e.g., NMOS or PMOS devices). As another example, at least some of these switches can be implemented as transmission gates (e.g., n-channel transistors and p-channel transistors coupled in parallel). As another example, at least some of these switches can be implemented as bipolar junction transistors. As another example, at least some of these switches can be implemented as micro-electro-mechanical systems (MEMS) switches. In general, any type of semiconductor switching device can be used.

Figure 5B:
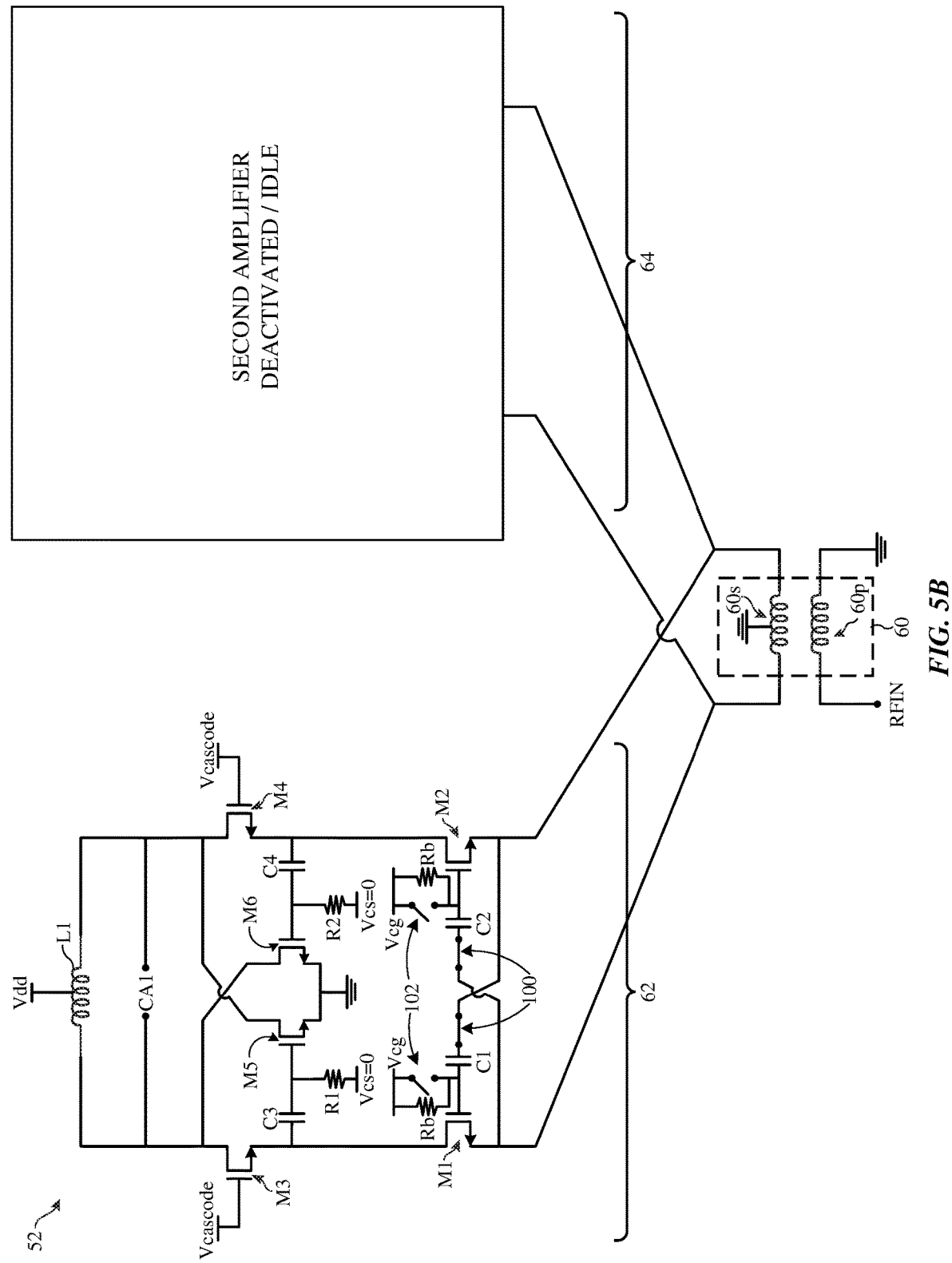
FIG. 5B is a circuit diagram showing the low noise amplifier circuitry of FIG. 5A operated in the non-carrier-aggregation mode in accordance with some embodiments.

FIG. 5B is a circuit diagram showing low noise amplifier circuitry 52 of FIG. 5A operated in the non-carrier-aggregation mode. As shown in FIG. 5B, second amplifier 64 is deactivated or idle in the non-carrier-aggregation mode. When second amplifier 64 is deactivated, current from secondary coil 60s will be fed to first amplifier 62. In the non-carrier-aggregation mode, switches 100 are activated (turned on) to enable the cross-coupled capacitor connections. Switches 102 are turned off so the gate terminals of transistors M1-M2 are biased using resistors Rb. Switching cross-coupled capacitors C1 and C2 into use can boost the transconductance of transistors M1 and M2 and can set the real part of the input impedance of the common gate amplifier stage (i.e., the impedance looking into the source terminals of transistors M1 and M2) equal to the inverse of the transconductance. In the non-carrier-aggregation mode, the common source amplifier stage in first amplifier 62 is turned off (e.g., by setting Vcs to 0 V).

Figure 5C:
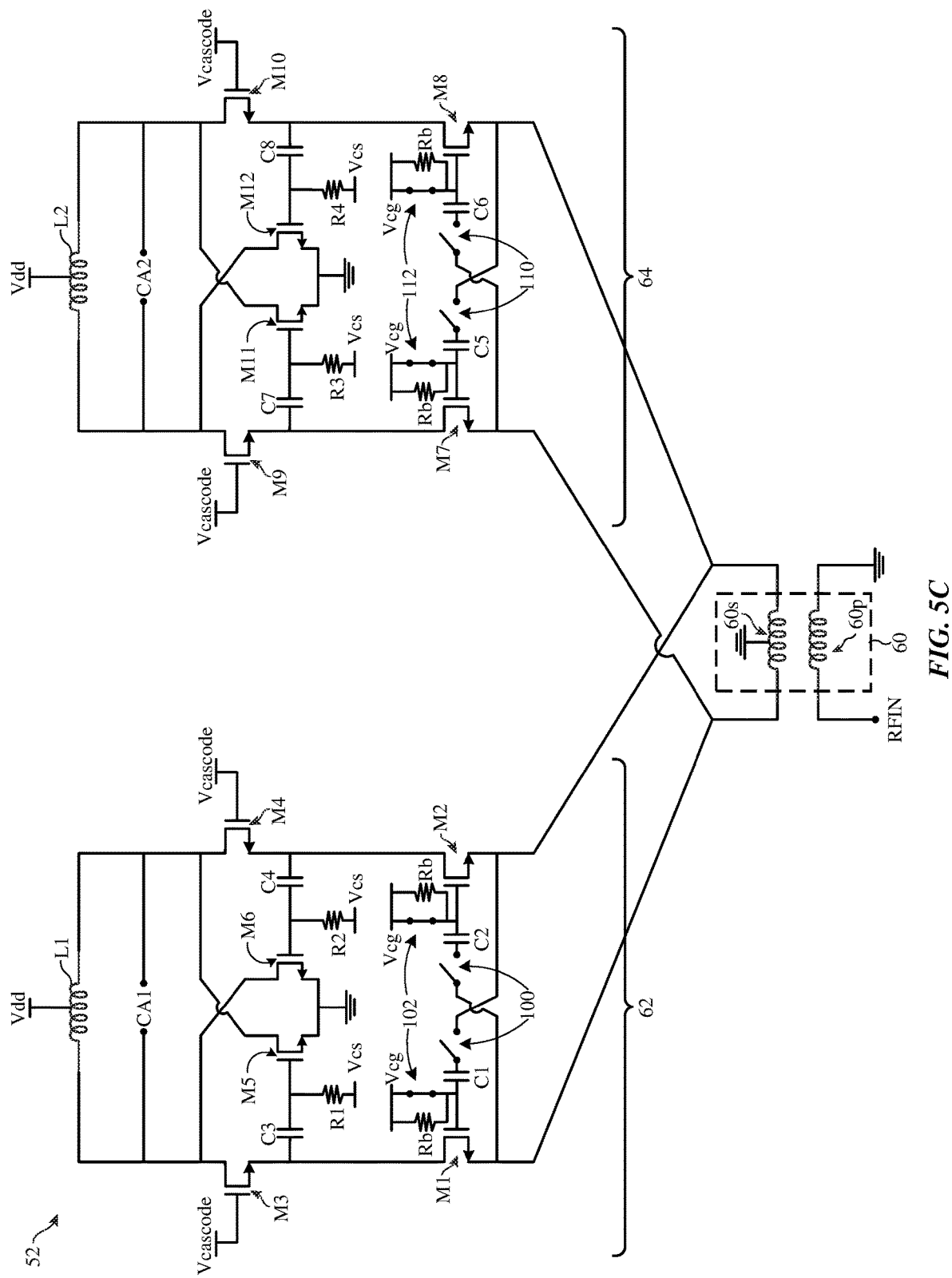
FIG. 5C is a circuit diagram showing the low noise amplifier circuitry of FIG. 5A operated in the carrier-aggregation mode in accordance with some embodiments.

FIG. 5C is a circuit diagram showing amplifier circuitry 52 operated in the carrier-aggregation mode. As shown in FIG. 5C, both first amplifier 62 and second amplifier 64 are activated in the carrier-aggregation mode. When both amplifiers 62 and 64 are in use, current from secondary transformer coil 60s will be split between first amplifier 62 and second amplifier 64. Splitting current between the two amplifiers will decrease the gain of each amplifier if no other change is made. To help recover any potential gain that might be lost due to the current split, the common source amplifier stage in first amplifier 62 and the common source amplifier stage in second amplifier 64 are activated by setting Vcs to a proper voltage value.

Operated in this way, the common source amplifier stage can help increase the gain of each amplifier in the carrier-aggregation mode. Cross-coupling the common source amplifier stage with the cascode amplifier stage can also cancel noise and higher order non-linearity terms such as third-order non-linearity (IM3) and/or other harmonic terms that might arise from the cascode amplifier stage. The gain of the common source amplifier stage should be matched to the gain of the cascode amplifier stage to ensure optimal cancelling of noise and the harmonic distortion components.

When both amplifier 62 and amplifier 64 are activated, the overall input impedance as seen from the two terminals of secondary coil 60s will be different than when only first amplifier 62 is activated. For instance, the first terminal of coil 60s will now convey current to the source terminals of both transistors M1 and M7, whereas the second terminal of coil 60s will convey current to the source terminals of both transistors M2 and M8. To compensate for this change in loading, the cross-coupled capacitors in each of the common gate stages are disabled by deactivating switches 100 and 110 in the carrier-aggregation mode. Switches 102 will be turned on to bias the gate terminals of transistors M1 and M2 to common gate bias voltage Vcg. Similarly, switches 112 will be turned on to bias the gate terminals of transistors M7 and M8 to voltage Vcg.

By deactivating the cross-coupled capacitors and activating the common gate biasing, the overall input impedance from the perspective of secondary coil 60s will again be equal to the inverse of the transconductance of transistors M1, M2, M7, and M8. The sizes of the common gate transistors M1, M2, M7, and M8 should be the same so that input impedance can be maintained and matched when switching between the non-carrier-aggregation mode and the carrier-aggregation mode. Thus, by activating on the cross-coupled common source stage and by deactivating the cross-coupled capacitors in the common gate stage, the gain and input impedance of amplifier circuitry 52 can be matched across the two modes 70 and 72.

Figure 6A:
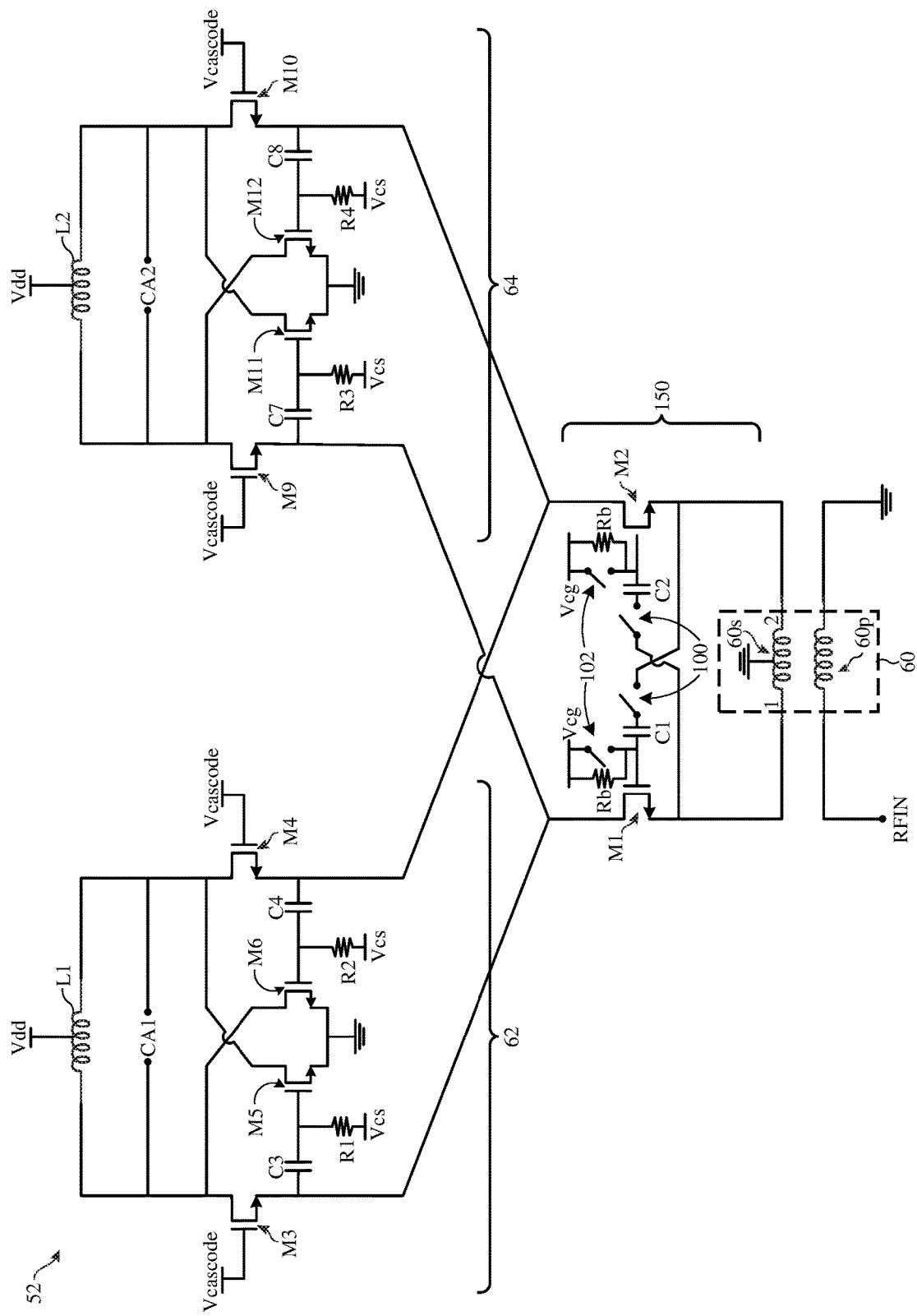
FIG. 6A is a circuit diagram of illustrative low noise amplifier circuitry having a signal split at a common gate amplifier output in accordance with some embodiments.

The embodiment of FIG. 5A in which the input signal is split at the input of the common gate amplifier stages is merely illustrative (e.g., secondary coil 60s has terminals coupled to both common gate amplifier stages in amplifiers 62 and 64). FIG. 6A shows another embodiment in which the input signal is split at the output of a shared common gate amplifier stage 150. Shared common gate amplifier stage 150 may include transistors M1 and M2.

Transistor M1 has a source (input) terminal coupled to the first terminal of secondary coil 60s, a gate (control) terminal, and a drain (output) terminal. Transistor M2 has a source (input) terminal coupled to the second terminal of secondary coil 60s, a gate terminal, and a drain (output) terminal. The gate terminal of transistor M1 may be selectively coupled to the source terminal of transistor M2 via a capacitor C1 by turning on and off a first switch 100. Similarly, the gate terminal of transistor M2 may be selectively coupled to the source terminal of transistor M1 via a capacitor C2 by turning on and off a second switch 100. Thus, when switches 100 are activated, transistors M1 and M2 are said to be cross-coupled via capacitors C1 and C2 (e.g., the control terminal of M1 is cross-coupled to the input terminal of M2 via C1, whereas the control terminal of M2 is cross-coupled to the input terminal of M1 via C2).

The gate terminal of transistor M1 can also be coupled to a common gate voltage line on which common gate voltage Vcg is provided via a first biasing resistor Rb and a first switch 102. When transistor M1 is on and connected to the cross-coupled capacitors C1 and C2 (i.e., when switches 100 are turned on), first switch 102 is off and the gate of transistor M1 is biased through resistor Rb connected to voltage Vcg. When transistor M1 is on and disconnected from the cross-coupled capacitors C1 and C2 (i.e., when switches 100 are turned off), first switch 102 is on and the gate of transistor M1 is directly connected to DC voltage Vcg. When transistor M1 is off, voltage Vcg is set to 0 V. Voltage Vcg may have some intermediate voltage level between the ground voltage level and a positive power supply voltage level Vdd that powers amplifier circuitry 52. If desired, common gate voltage Vcg may also be equal to positive power supply voltage Vdd.

Similarly, the gate terminal of transistor M2 can also be coupled to the common gate voltage line via a second biasing resistor Rb and a second switch 102. When transistor M2 is on and connected to the cross-coupled capacitors C1 and C2 (i.e., when switches 100 are turned on), second switch 102 is off and the gate of transistor M2 is biased through second resistor Rb connected to voltage Vcg. When transistor M2 is on and disconnected from the cross-coupled capacitors C1 and C2 (i.e., when switches 100 are turned off), second switch 102 is on and the gate of transistor M2 is directly connected to DC voltage Vcg. When transistor M2 is off, voltage Vcg is set to 0 V. Transistors M1 and M2, along with cross-coupled capacitors C1 and C2 and the associated switches 100 and 102, operated in this way may therefore sometimes be referred to collectively as a common gate amplifier stage. Switches 100 and 102 and the DC voltage level of Vcg may therefore be used to control the shared common gate amplifier stage.

The output (drain) terminal of transistor M1 can then be coupled to first amplifier 62 and second amplifier 64. Similarly, the output (drain) terminal of transistor M2 can then be coupled to first amplifier 62 and second amplifier 64. First amplifier 62 may include a first cascode common gate amplifier stage (which includes transistors M3 and M4) and a first cross-coupled common source amplifier stage (which includes components M5, M6, C3, C4, R1, and R2), the details of which are similar to that already described in connection with FIG. 5A and need not be reiterated for the sake of clarity. Second amplifier 62 may include a second cascode common gate amplifier stage (which includes transistors M9 and M10) and a second cross-coupled common source amplifier stage (which includes components M11, M12, C7, C8, R3, and R4), the details of which are also similar to that already described in connection with FIG. 5A and need not be reiterated for the sake of clarity. Although shared common gate amplifier stage 150 is shown as a separate sub-circuit from amplifiers 62 and 64, amplifier stage 150 may sometimes be considered to be a part of first amplifier 62 and part of second amplifier 64.

Figure 6B:
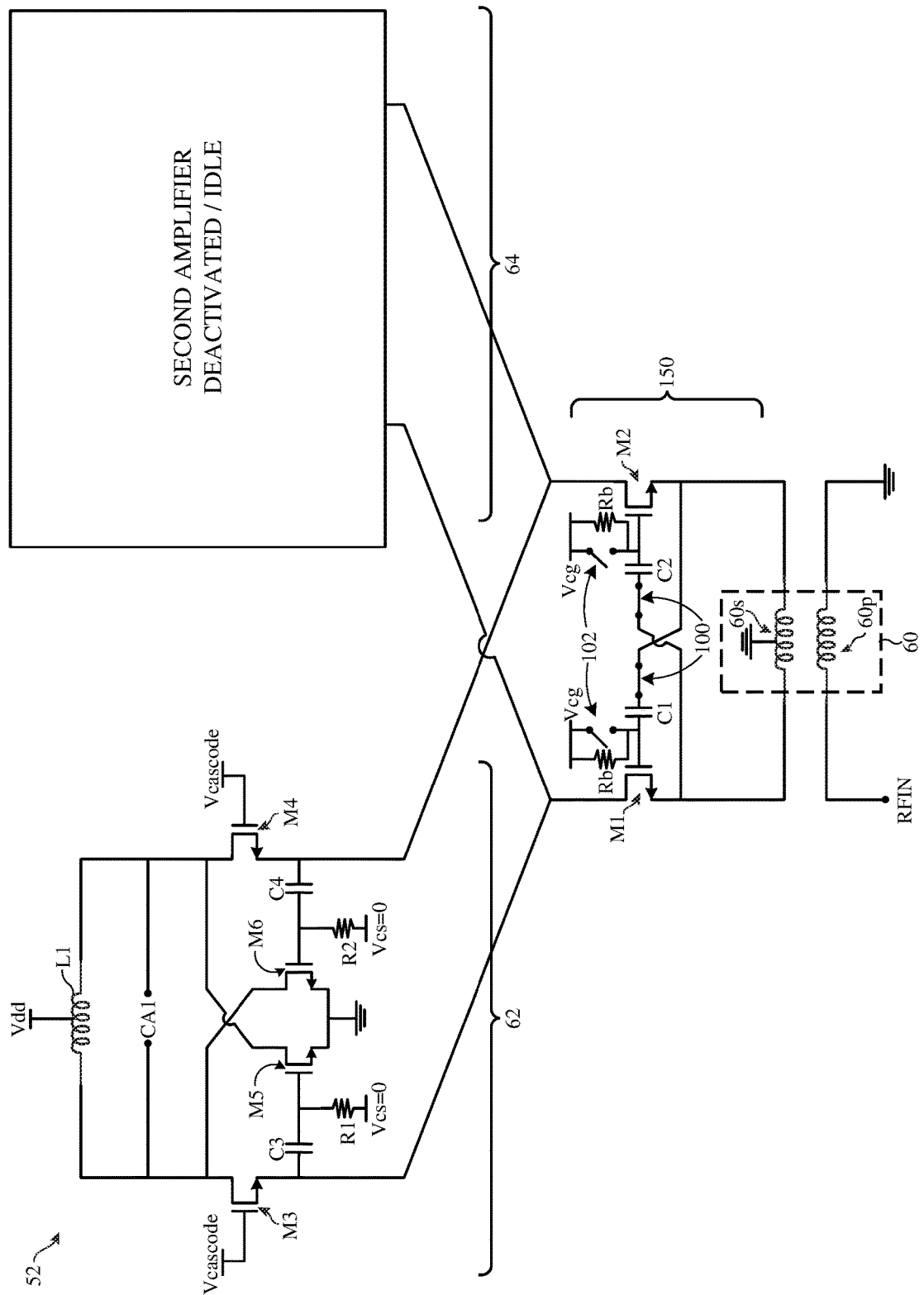
FIG. 6B is a circuit diagram showing the low noise amplifier circuitry of FIG. 6A operated in the non-carrier-aggregation mode in accordance with some embodiments.

FIG. 6B is a circuit diagram showing low noise amplifier circuitry 52 of FIG. 6A operated in the non-carrier-aggregation mode. As shown in FIG. 6B, second amplifier 64 is deactivated or idle in the non-carrier-aggregation mode. When second amplifier 64 is deactivated, current from the output of shared common gate amplifier stage 150 will be fed to first amplifier 62. In the non-carrier-aggregation mode, switches 100 are activated (turned on) to enable the cross-coupled capacitor connections. Switching cross-coupled capacitors C1 and C2 into use can boost the transconductance of transistors M1 and M2 and can set the real part of the input impedance of the shared common gate amplifier stage (i.e., the impedance looking into the source terminals of transistors M1 and M2) equal to the inverse of the transconductance. In the non-carrier-aggregation mode, the common source amplifier stage in first amplifier 62 is deactivated (e.g., by setting Vcs to 0 V).

Figure 6C:
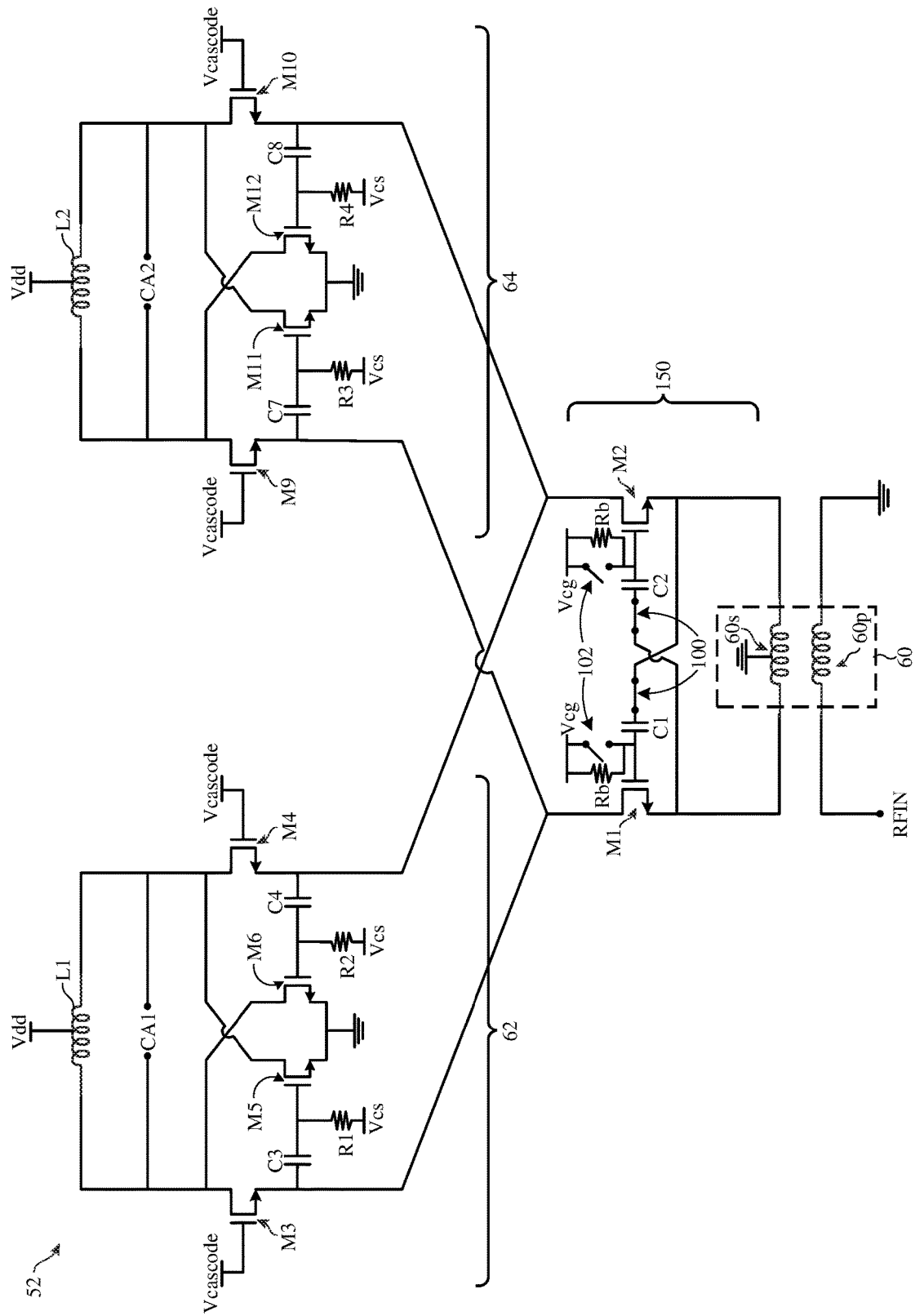
FIG. 6C is a circuit diagram showing the low noise amplifier circuitry of FIG. 6A operated in the carrier-aggregation mode by activating cross-coupled capacitors at the common gate stage in accordance with some embodiments.

FIG. 6C is a circuit diagram showing amplifier circuitry 52 operated in the carrier-aggregation mode. As shown in FIG. 6C, both first amplifier 62 and second amplifier 64 are activated in the carrier-aggregation mode. When both amplifiers 62 and 64 are in use, current from shared common gate amplifier stage 150 will be split between first amplifier 62 and second amplifier 64. Splitting current between the two amplifiers will decrease the gain of each amplifier if no other change is made. To help recover any potential gain that might be lost due to the signal split, the common source amplifier stage in first amplifier 62 and the common source amplifier stage in second amplifier 64 are activated by setting Vcs to a proper voltage level.

Operated in this way, the common source amplifier stage can help increase the gain of each amplifier in the carrier-aggregation mode. Cross-coupling the common source amplifier stage with the cascode amplifier stage can also cancel noise and higher order non-linearity terms such as third-order non-linearity (IM3) and/or other harmonic terms that might arise from the cascode amplifier stage. The gain of the common source amplifier stage should be matched to the gain of the cascode amplifier stage to ensure optimal cancelling of noise and the harmonic distortion components.

Since the common gate amplifier stage 150 is shared between first amplifier 62 and second amplifier 64, switches 100 can remain activated in the carrier-aggregation mode and still maintain input impedance matching. Thus, the input impedance from the perspective of secondary coil 60s can remain the same without changing the switching configuration of the shared common gate amplifier stage 150 when switching between the non-carrier-aggregation mode and the carrier-aggregation mode (e.g., switches 100 are turned on in both mode 70 and mode 72).

Figure 6D:
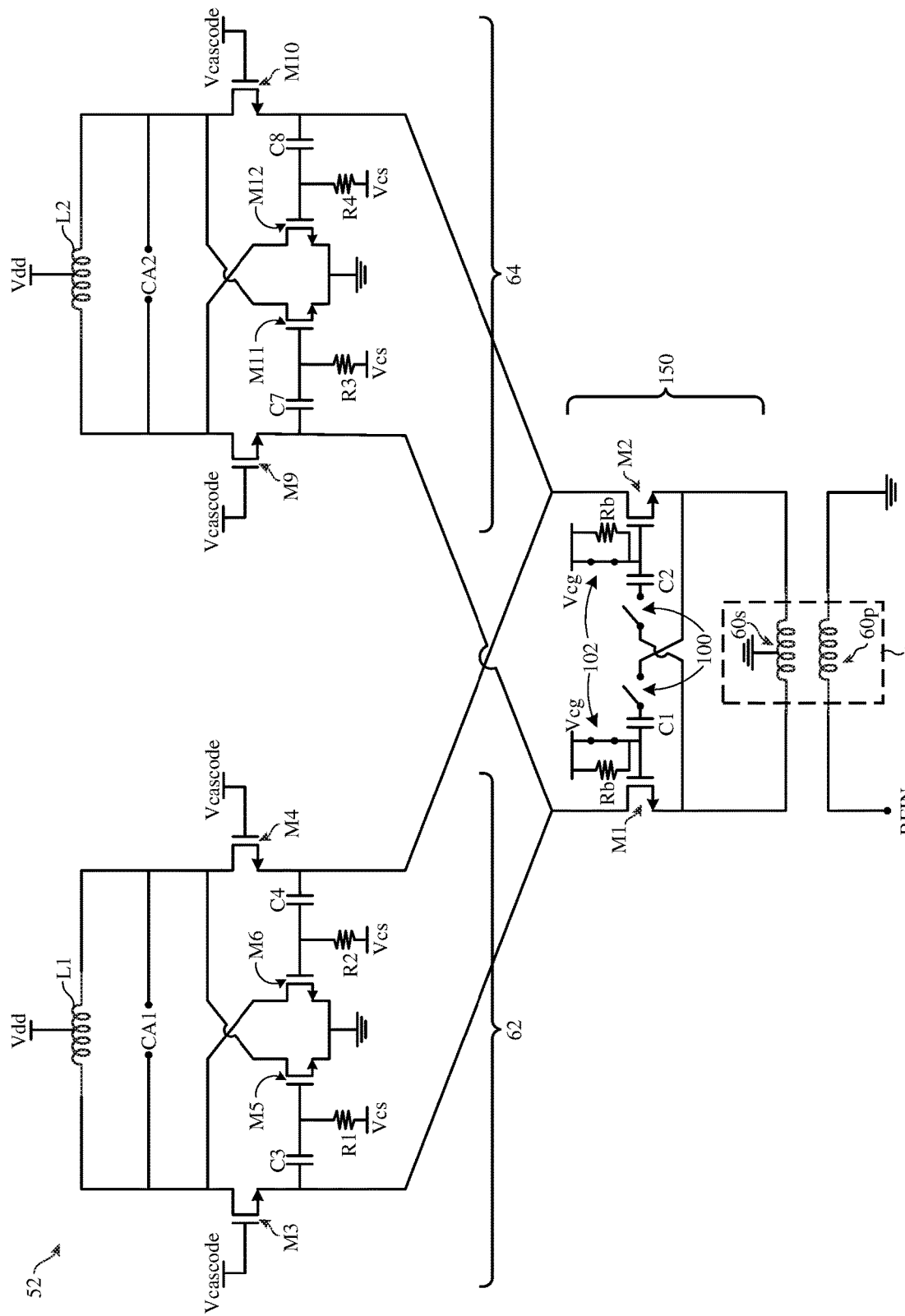
FIG. 6D is a circuit diagram showing the low noise amplifier circuitry of FIG. 6A operated in the carrier-aggregation mode by increasing current in accordance with some embodiments.

The example of FIG. 6C in which the cross-coupled capacitors in the shared common gate amplifier stage remains unchanged when switching between the non-carrier-aggregation mode and the carrier-aggregation mode is merely illustrative. FIG. 6D illustrates another embodiment in which the cross-coupled capacitors in shared common gate amplifier stage 150 is deactivated in the carrier-aggregation mode. As shown in FIG. 6D, both first amplifier 62 and second amplifier 64 are activated in the carrier-aggregation mode. When both amplifiers 62 and 64 are in use, current from shared common gate amplifier stage 150 will be split between first amplifier 62 and second amplifier 64. Splitting current between the two amplifiers will decrease the gain of each amplifier if no other change is made. To help recover any potential gain that might be lost due to the signal split, the common source amplifier stage in first amplifier 62 and the common source amplifier stage in second amplifier 64 are activated by setting Vcs to a proper voltage level.

Operated in this way, the common source amplifier stage can help increase the gain of each amplifier in the carrier-aggregation mode. Cross-coupling the common source amplifier stage with the cascode amplifier stage can also cancel noise and higher order non-linearity terms such as third-order non-linearity (IM3) and/or other harmonic terms that might arise from the cascode amplifier stage. The gain of the common source amplifier stage should be matched to the gain of the cascode amplifier stage to ensure optimal cancelling of noise and the harmonic distortion components.

In the example of FIG. 6D, switches 100 are turned off to deactivate the cross-coupled capacitors C1 and C2, and switches 102 are turned on to bias the gate terminals of transistors M1 and M2 to the common gate bias voltage Vcg. Deactivating cross-coupled capacitors C1 and C2 in shared common gate amplifier stage 150 may reduce the transconductance of transistors M1 and M2, which can alter the input impedance of common gate amplifier stage 150. To compensate for this reduction in the transconductance, the current flowing through transistors M1 and M2 can be increased by raising common gate bias voltage Vcg. Elevating voltage Vcg in the carrier-aggregation mode can help boost the transconductance of transistors M1 and M2 and improve the linearity of amplifier circuitry 52. Thus, even though the cross-coupled capacitors are deactivated, boosting common gate voltage Vcg to increase the transconductance of transistors M1 and M2 can help maintain input impedance matching in the carrier-aggregation mode.

Figure 7A:
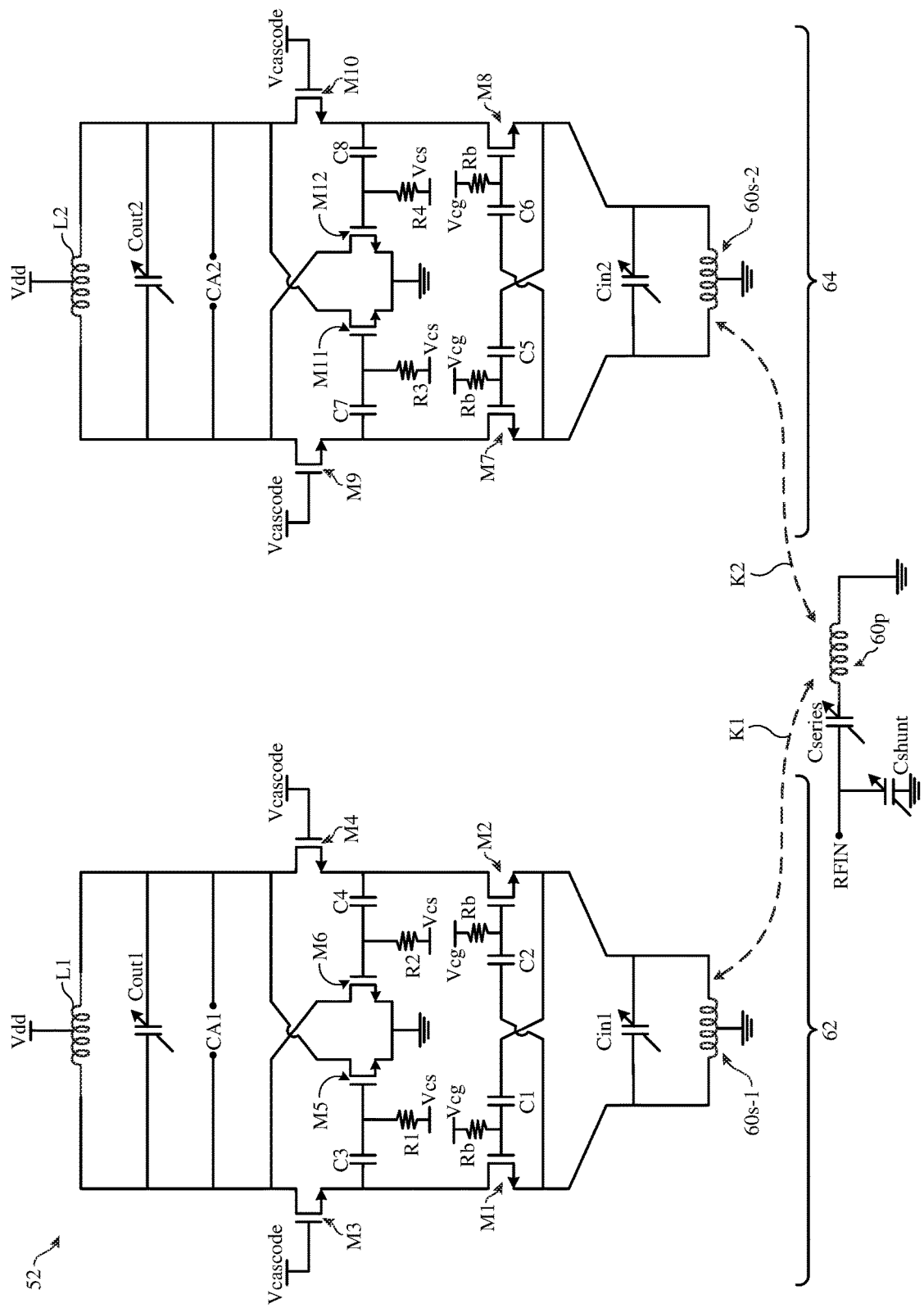
FIG. 7A is a circuit diagram of illustrative low noise amplifier circuitry having amplifiers with separate tunable transformer circuitry in accordance with some embodiments.

The embodiments of FIGS. 5A and 6A where secondary coil 60s is coupled to both first amplifier 62 and second amplifier 64 is merely illustrative. FIG. 7A shows another embodiment of amplifier circuitry 52 in which amplifiers 62 and 64 each have its own separate secondary transformer coil. Primary coil 60p has a first terminal coupled to input port RFIN via a series capacitor Cseries and a second terminal coupled to the ground line. A shunt capacitor Cshunt is also coupled to input port RFIN. Capacitors Cseries and Cshunt can sometimes be considered to be a part of the input transformer circuitry. Capacitors Cseries and Cshunt may be adjustable capacitors. In general, adjustable capacitors may be implemented as an array (bank) of capacitors a portion of which can be activated depending on the desired capacitance value, a variable capacitor sometimes referred to as a varactor or varicap, voltage tuned capacitors, digitally tuned capacitors, mechanically controlled variable capacitors, a combination of these capacitors, or other types of tunable capacitive components.

First amplifier 62 has a first secondary coil 60s-1 inductively coupled to primary coil 60p (see, e.g., first coupling path K1). Secondary coil 60s-1 has a first terminal coupled to the input (source) terminal of transistor M1, a second terminal coupled to the input (source) terminal of transistor M2, and a center tap coupled to ground. A first amplifier input capacitor Cin1 may be coupled across (in parallel with) secondary coil 60s-1. Capacitor Cin1 may also be an adjustable capacitive component having different capacitance values in the non-carrier-aggregation mode and the carrier-aggregation mode. Capacitor Cin1 may therefore sometimes also be referred to as an adjustable input shunt capacitor.

The common gate amplifier stage of first amplifier 62 may have capacitors C1 and C2 that are always cross-coupled with transistors M1 and M2. The tuning capability of capacitor Cin1 obviates the need for additional switches such as switches 100 and 102 in FIG. 5A. The gate terminals of M1 and M2 may be biased to voltage Vcg using respective biasing resistors Rb. If desired, however, switches 100 and 102 may also be included as part of the common gate amplifier stage to provide flexibility. First amplifier 62 may further include a first cascode common gate amplifier stage (which includes transistors M3 and M4) and a first cross-coupled common source amplifier stage (which includes components M5, M6, C3, C4, R1, and R2), the details of which are similar to that already described in connection with FIG. 5A and need not be reiterated for the sake of clarity. If desired, a first output capacitor Cout1 may also be coupled across the first carrier aggregation output port CA1. The capacitance of Cout1 may be the same in the non-carrier-aggregation mode and the carrier-aggregation mode. Capacitor Cout11 may also be an adjustable capacitive component that is controlled for the purpose of frequency response tuning and/or channel selection.

Second amplifier 64 has another secondary coil 60s-2 inductively coupled to primary coil 60p (see, e.g., second coupling path K2). Secondary coil 60s-2 has a first terminal coupled to the input (source) terminal of transistor M7, a second terminal coupled to the input (source) terminal of transistor M8, and a center tap coupled to ground. A second amplifier input capacitor Cin2 may be coupled across (in parallel with) secondary coil 60s-2. Capacitor Cin2 may also be an adjustable capacitive component having different capacitance values in the non-carrier-aggregation mode and the carrier-aggregation mode. Capacitor Cin2 may therefore sometimes also be referred to as an adjustable input shunt capacitor.

The common gate amplifier stage of second amplifier 64 may have capacitors C5 and C6 that are always cross-coupled with transistors M7 and M8. The tuning capability of capacitor Cin2 obviates the need for additional switches such as switches 110 and 112 in FIG. 5A. The gate terminals of M7 and M8 may be biased to voltage Vcg using respective biasing resistors Rb. If desired, however, switches 110 and 112 may also be included as part of the common gate amplifier stage in second amplifier 64 to provide flexibility. Second amplifier 64 may further include a second cascode common gate amplifier stage (which includes transistors M9 and M10) and a second cross-coupled common source amplifier stage (which includes components M11, M12, C7, C8, R3, and R4), the details of which are similar to that already described in connection with FIG. 5A and need not be reiterated for the sake of clarity. If desired, a second output capacitor Cout2 may also be coupled across the second carrier aggregation output port CA2. The capacitance of Cout2 may be the same in the non-carrier-aggregation mode and the carrier-aggregation mode. Capacitor Cout12 may also be an adjustable capacitive component that is controlled for the purpose of frequency response tuning and/or channel selection.

Figure 7B:
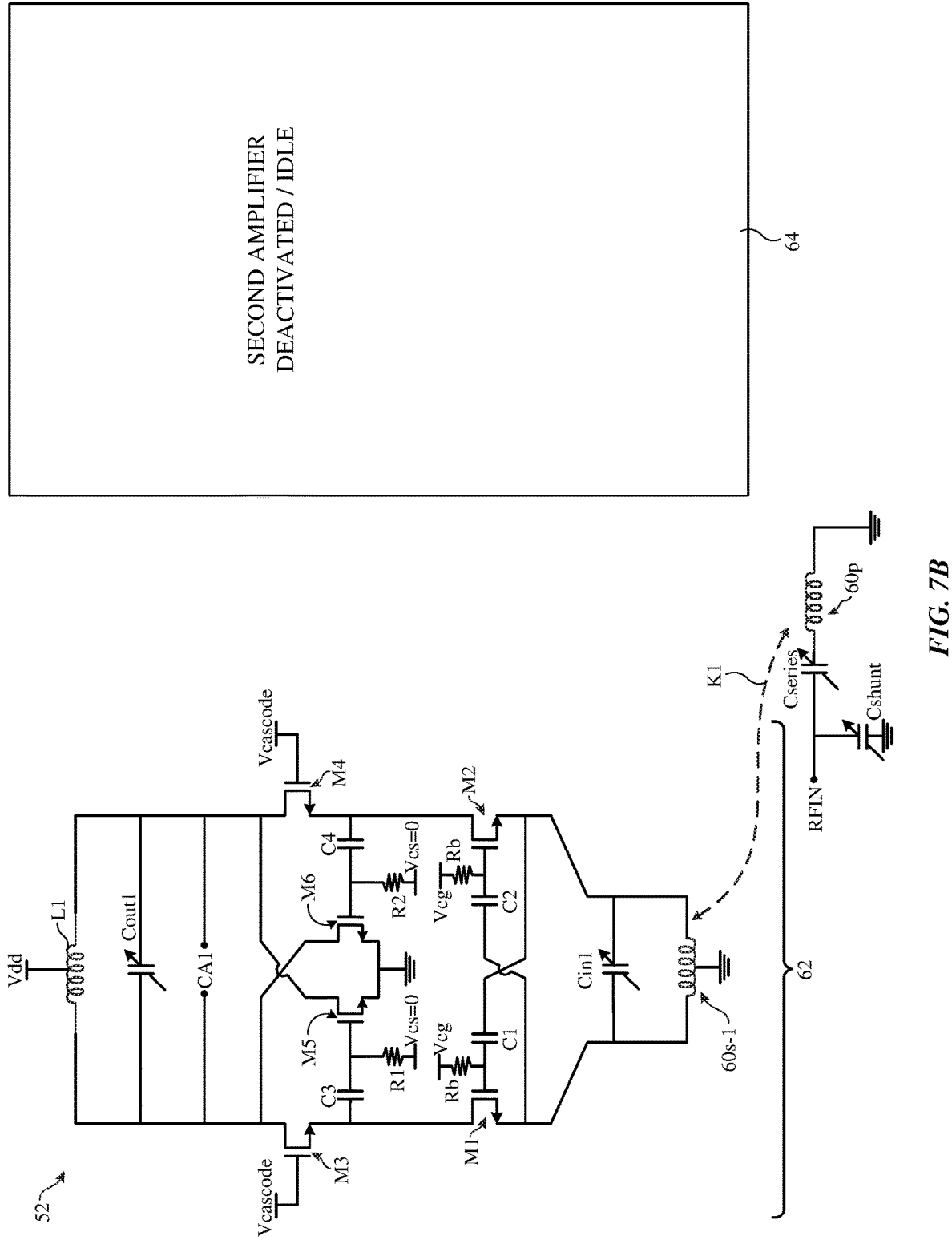
FIG. 7B is a circuit diagram showing the low noise amplifier circuitry of FIG. 7A operated in the non-carrier-aggregation mode in accordance with some embodiments.

FIG. 7B is a circuit diagram showing low noise amplifier circuitry 52 of FIG. 7A operated in the non-carrier-aggregation mode. As shown in FIG. 7B, second amplifier 64 is deactivated or idle in the non-carrier-aggregation mode. Current flowing through primary coil 60p will generate an electromagnetic flux in the transformer, which will induce a corresponding current to flow through secondary coil 60s-1. In the non-carrier-aggregation mode, capacitor Cin1 will be adjusted to a first capacitance value to provide the necessary input impedance matching at the input of first amplifier 62. In the non-carrier-aggregation mode, the common source amplifier stage in first amplifier 62 is turned off (e.g., by setting Vcs to 0 V).

Figure 7C:
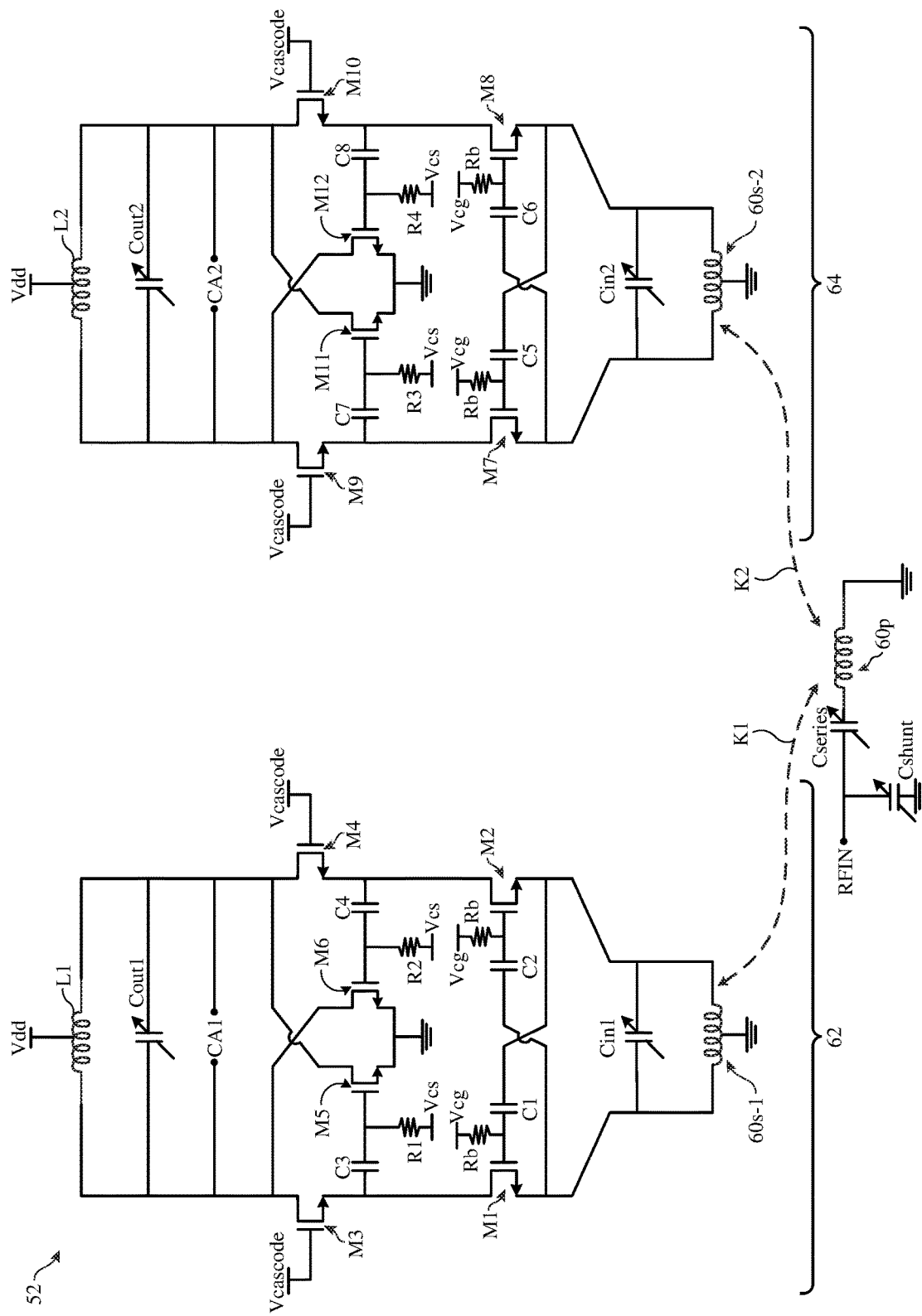
FIG. 7C is a circuit diagram showing the low noise amplifier circuitry of FIG. 7A operated in the carrier-aggregation mode in accordance with some embodiments.

FIG. 7C is a circuit diagram showing amplifier circuitry 52 operated in the carrier-aggregation mode. As shown in FIG. 7C, both first amplifier 62 and second amplifier 64 are activated in the carrier-aggregation mode. When both amplifiers 62 and 64 are in use, current flowing through primary coil 60p will generate an electromagnetic flux in the transformer, which will induce a corresponding current to flow through secondary coil 60s-1 and a corresponding current to flow through secondary coil 60s-2. In the carrier-aggregation mode, capacitor Cin1 will be adjusted to a second capacitance value to provide the necessary input impedance matching at the input of first amplifier 62. Similarly, capacitor Cin2 can be adjusted to the second capacitance value to provide the requisite input impedance matching at the input of second amplifier 64. Adjusting capacitors Cin1 and Cin2 can therefore help maintain input impedance matching for amplifier circuitry 52 when switching between the non-carrier-aggregation mode and the carrier-aggregation mode.

During the carrier-aggregation mode, the common source amplifier stage in first amplifier 62 and the common source amplifier stage in second amplifier 64 are activated by setting Vcs to a proper voltage value. Cross-coupling the common source amplifier stage with the cascode amplifier stage can help cancel noise and higher order non-linearity terms such as third-order non-linearity (IM3) and/or other harmonic terms that might arise from the cascode amplifier stage. The gain of the common source amplifier stage should be matched to the gain of the cascode amplifier stage to ensure optimal cancelling of noise and the harmonic distortion components.

The methods and operations described above in connection with FIGS. 1-7 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. Amplifier circuitry operable in a carrier-aggregation mode and a non-carrier-aggregation mode, the amplifier circuitry comprising:
    an input port configured to receive radio-frequency signals from an antenna;
    transformer circuitry coupled to the input port;
    a first amplifier coupled to the transformer circuitry; and
    a second amplifier coupled to the transformer circuitry, the first amplifier and the second amplifier each including
        a common gate amplifier stage having an input coupled to the transformer circuitry and having an output,
        a common source amplifier stage coupled to the output of the common gate amplifier stage, the common source amplifier stage coupled to a common source bias voltage that is configured to activate and deactivate the common source amplifier stage in the carrier-aggregation mode and the non-carrier-aggregation mode, and
        an output port coupled to the output of the common gate amplifier stage.

2. The amplifier circuitry of claim 1, wherein the transformer circuitry comprises:
    a primary coil having a first terminal coupled to the input port and a second terminal coupled to a ground line;
    a first adjustable capacitor coupled in series between the input port and the first terminal; and
    a second adjustable capacitor having a first terminal coupled to the input port and a second terminal coupled to the ground line.

3. The amplifier circuitry of claim 2, wherein the transformer circuitry comprises:
    a first secondary coil coupled to the input of the common gate amplifier stage in the first amplifier;
    a third adjustable capacitor coupled in parallel with the first secondary coil, the third adjustable capacitor being configured to control an input impedance of the first amplifier in the non-carrier-aggregation mode and the carrier-aggregation mode;
    a second secondary coil coupled to the input of the common gate amplifier stage in the second amplifier; and
    a fourth adjustable capacitor coupled in parallel with the second secondary coil, the fourth adjustable capacitor being configured to control an input impedance of the second amplifier in the non-carrier-aggregation mode and the carrier-aggregation mode.

4. The amplifier circuitry of claim 1, wherein the common gate amplifier stage in each of the first amplifier and the second amplifier comprises:
    a first transistor having a source terminal coupled to the input of the common gate amplifier stage, a drain terminal coupled to the output of the common gate amplifier stage, and a gate terminal;
    a second transistor having a source terminal coupled to the input of the common gate amplifier stage, a drain terminal coupled to the output of the common gate amplifier stage, and a gate terminal;
    a first capacitor having a first terminal coupled to the gate terminal of the first transistor and having a second terminal coupled to the source terminal of the second transistor; and
    a second capacitor having a first terminal coupled to the gate terminal of the second transistor and having a second terminal coupled to the source terminal of the first transistor.

5. The amplifier circuitry of claim 1, wherein each of the first amplifier and the second amplifier comprises a cascode amplifier stage having:
    an input coupled to the output of the common gate amplifier stage;
    an output coupled to the output port;
    a first transistor having a source terminal coupled to the input of the cascode amplifier stage, a drain terminal coupled to the output of the cascode amplifier stage, and a gate terminal coupled to a cascode bias line; and
    a second transistor having a source terminal coupled to the input of the cascode amplifier stage, a drain terminal coupled to the output of the cascode amplifier stage, and a gate terminal coupled to the cascode bias line.

6. The amplifier circuitry of claim 5, wherein the common source amplifier stage in each of the first amplifier and the second amplifier comprises:
    a third transistor having a source terminal coupled to a ground line, a gate terminal coupled to the source terminal of the first transistor, and a drain terminal coupled to the drain terminal of the second transistor; and
    a fourth transistor having a source terminal coupled to a ground line, a gate terminal coupled to the source terminal of the second transistor, and a drain terminal coupled to the drain terminal of the first transistor.

7. The amplifier circuitry of claim 1, wherein the first amplifier and the second amplifier each comprises:
    an output coil having a first terminal coupled to the output port, a second terminal coupled to the output port, and a center tap coupled to a positive power supply line.

8. The amplifier circuitry of claim 7, wherein the first amplifier and the second amplifier each comprises:
    an adjustable output capacitor having a first terminal coupled to the first terminal of the output coil and a second terminal coupled to the second terminal of the output coil.

9. The amplifier circuitry of claim 1, wherein the transformer circuitry comprises:
    a primary coil having a first terminal coupled to the input port and a second terminal coupled to a ground line; and
    a secondary coil having a first terminal coupled to the first amplifier and the second amplifier and a second terminal coupled to the first amplifier and the second amplifier.

10. The amplifier circuitry of claim 9, wherein the common gate amplifier stage in each of the first amplifier and the second amplifier comprises:
    a first transistor having a source terminal coupled to the input of the common gate amplifier stage, a drain terminal coupled to the output of the common gate amplifier stage, and a gate terminal;
    a second transistor having a source terminal coupled to the input of the common gate amplifier stage, a drain terminal coupled to the output of the common gate amplifier stage, and a gate terminal;

a first capacitor having a first terminal coupled to the gate terminal of the first transistor and a second terminal coupled to the source terminal of the second transistor; and a second capacitor having a first terminal coupled to the gate terminal of the second transistor and a second terminal coupled to the source terminal of the first transistor.

11. The amplifier circuitry of claim 10, wherein the common gate amplifier stage in each of the first amplifier and the second amplifier comprises:

a first set of switches configured to activate and deactivate the first and second capacitors in the non-carrier-aggregation mode and the carrier-aggregation mode; and a second set of switches configured to couple the gate terminal of the first transistor and the gate terminal of the second transistor to a common gate bias line.

12. The amplifier circuitry of claim 9, wherein the amplifier circuitry includes only one common gate amplifier stage that is shared between the first amplifier and the second amplifier, the shared common gate amplifier stage comprising:

a first transistor having a source terminal coupled to the first terminal of the secondary coil, a drain terminal coupled to the first amplifier and the second amplifier, and a gate terminal;

a second transistor having a source terminal coupled to the second terminal of the secondary coil, a drain terminal coupled to the first amplifier and the second amplifier, and a gate terminal;

a first capacitor having a first terminal coupled to the gate terminal of the first transistor and a second terminal coupled to the source terminal of the second transistor;

a second capacitor having a first terminal coupled to the gate terminal of the second transistor and a second terminal coupled to the source terminal of the first transistor;

a first set of switches configured to activate and deactivate the first and second capacitors in the non-carrier-aggregation mode and the carrier-aggregation mode; and a second set of switches configured to couple the gate terminal of the first transistor and the gate terminal of the second transistor to a common gate bias line.

13. A method of operating amplifier circuitry, comprising:

with an input port, receiving radio-frequency signals from an antenna;

with transformer circuitry, coupling the radio-frequency signals from the input port to a first amplifier;

with the transformer circuitry, coupling the radio-frequency signals from the input port to a second amplifier;

with a common gate amplifier stage in each of the first and second amplifiers, receiving the radio-frequency signals from the transformer circuitry and outputting corresponding amplified signals;

with a common source amplifier stage in each of the first and second amplifiers, receiving the amplified signals and outputting corresponding carrier aggregation output signals; and adjusting a common source bias voltage in the common source amplifier stage in each of the first and second amplifiers in a carrier-aggregation mode and a non-carrier-aggregation mode.

14. The method of claim 13, further comprising:

with a first input capacitor coupled to the first amplifier, tuning an input impedance of the first amplifier in the carrier-aggregation mode and the non-carrier-aggregation mode; and with a second input capacitor coupled to the second amplifier, tuning an input impedance of the second amplifier in the carrier-aggregation mode and the non-carrier-aggregation mode.

15. The method of claim 13, further comprising:

with a first set of switches, activating and deactivating a set of cross-coupling capacitors in the common gate amplifier stage in non-carrier-aggregation mode and the carrier-aggregation mode.

16. The method of claim 15, further comprising:

with a second set of switches, coupling and decoupling the common gate amplifier stage to and from a common gate bias voltage in carrier-aggregation mode and the non-carrier-aggregation mode.

17. An electronic device operable in a carrier-aggregation mode and a non-carrier-aggregation mode, comprising:

an antenna configured to receive radio-frequency signals;

a transceiver configured to generate baseband signals based on the radio-frequency signals;

a baseband processor configured to receive the baseband signals; and amplifier circuitry configured to receive the radio-frequency signals from the antenna and to output corresponding amplified signals to the transceiver, the amplifier circuitry having an input port, transformer circuitry coupled to the input port, a common gate amplifier stage having an input coupled to the transformer circuitry and having an output, a common source amplifier stage coupled to the output of the common gate amplifier stage, the common source amplifier stage coupled to a common source bias voltage configured to control the common source stage in the non-carrier-aggregation mode and the carrier-aggregation mode, and an output port coupled to the output of the common gate amplifier stage.

18. The electronic device of claim 17, wherein the amplifier circuitry further comprises:

an additional common gate amplifier stage having an input coupled to the transformer circuitry and having an output; and an additional common source amplifier stage coupled to the output of the additional common gate amplifier stage, the additional common source amplifier also coupled to the common source bias voltage.

19. The electronic device of claim 17, wherein the transformer circuitry includes a primary coil having a first terminal coupled to the input port and a second terminal coupled to ground, the transformer circuitry includes a secondary coil coupled to the input of the common gate amplifier stage, and the amplifier circuitry includes an adjustable capacitor coupled in parallel with the secondary coil, the adjustable capacitor being configured to tune an input impedance of the common gate amplifier stage in the non-carrier-aggregation mode and the carrier-aggregation mode.

20. The electronic device of claim 17, wherein the amplifier circuitry includes a cascode amplifier stage having an input coupled to the output of the common gate amplifier stage and an output coupled to the output port, and wherein the common gate amplifier stage comprises:
- a first transistor having a source terminal coupled to the transformer circuitry, a drain terminal coupled to the input of the cascode amplifier stage, and a gate terminal;
- a second transistor having a source terminal coupled to the transformer circuitry, a drain terminal coupled to the input of the cascode amplifier stage, and a gate terminal;
- a first capacitor having a first terminal coupled to the gate terminal of the first transistor and a second terminal coupled to the source terminal of the second transistor;
- a second capacitor having a first terminal coupled to the gate terminal of the second transistor and a second terminal coupled to the source terminal of the first transistor;
- a first set of switches configured to activate and deactivate the first and second capacitors in the non-carrier-aggregation mode and the carrier-aggregation mode; and
- a second set of switches configured to couple the gate terminal of the first transistor and the gate terminal of the second transistor to a common gate bias line.

* * * * *